(12) United States Patent
Fukami et al.

(10) Patent No.: US 11,557,719 B2
(45) Date of Patent: Jan. 17, 2023

(54) MAGNETORESISTANCE EFFECT ELEMENT, CIRCUIT DEVICE, AND CIRCUIT UNIT

(71) Applicant: TOHOKU UNIVERSITY, Miyagi (JP)

(72) Inventors: Shunsuke Fukami, Miyagi (JP); Aleksandr Kurenkov, Miyagi (JP); William Andrew Borders, Miyagi (JP); Hideo Ohno, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 168 days.

(21) Appl. No.: 16/967,364

(22) PCT Filed: Jan. 30, 2019

(86) PCT No.: PCT/JP2019/003165
§ 371 (c)(1),
(2) Date: Dec. 23, 2020

(87) PCT Pub. No.: WO2019/155957
PCT Pub. Date: Aug. 15, 2019

(65) Prior Publication Data
US 2021/0119114 A1  Apr. 22, 2021

(30) Foreign Application Priority Data
Feb. 6, 2018  (JP) .............................. JP2018-019686

(51) Int. Cl.
*G11C 11/00* (2006.01)
*H01L 43/04* (2006.01)
(Continued)

(52) U.S. Cl.
CPC ............. *H01L 43/04* (2013.01); *G06N 3/063* (2013.01); *G11C 11/161* (2013.01);
(Continued)

(58) Field of Classification Search
CPC ....... H01L 43/04; H01L 27/222; H01L 43/06; H01L 43/10; G11C 11/161; G11C 11/1673; G11C 11/1675; G11C 11/18; G11C 11/54
(Continued)

(56) References Cited

U.S. PATENT DOCUMENTS 8,064,246 B2 * 11/2011 Slonczewski ........... H01F 10/24
365/158
10,482,987 B2 * 11/2019 Sasaki .................... G11C 27/00
(Continued)

FOREIGN PATENT DOCUMENTS

CN   107004440 A *  8/2017 ........... G11C 11/161
JP   2010103303 A    5/2010
(Continued)

OTHER PUBLICATIONS

Nishitani, Y. et al., "Ferroelectric synapse device with brain-like learning function: Analog conductance control in a ferroelectric-gate fieldeffect transistor based on the timing difference between two pulses", Extended Abstracts of the 2012 International Conference on Solid State Devices and Materials, 2012, pp. 1140-1141.
(Continued)

*Primary Examiner* — Viet Q Nguyen
(74) *Attorney, Agent, or Firm* — Fox Rothschild LLP; Robert J. Sacco; Carol E. Thorstad-Forsyth

(57) ABSTRACT

There is provided a magnetoresistance effect element includes: a channel layer that extends in a first direction; a recording layer which includes a film formed from a ferromagnetic material, of which a magnetization state is changed to one of two or greater magnetization states, and which is formed on the channel layer; a non-magnetic layer that is provided on a surface of the recording layer; a reference layer which is provided on a surface of the
(Continued)

non-magnetic layer, which includes a film formed from a ferromagnetic material, and of which a magnetization direction is fixed; a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and a third terminal that is electrically connected to the reference layer.

26 Claims, 18 Drawing Sheets

(51) Int. Cl.
    *G06N 3/063*     (2006.01)
    *G11C 11/16*     (2006.01)
    *G11C 11/18*     (2006.01)
    *G11C 11/54*     (2006.01)
    *H01L 27/22*     (2006.01)
    *H01L 43/06*     (2006.01)
    *H01L 43/10*     (2006.01)

(52) U.S. Cl.
    CPC ...... *G11C 11/1673* (2013.01); *G11C 11/1675* (2013.01); *G11C 11/18* (2013.01); *G11C 11/54* (2013.01); *H01L 27/222* (2013.01); *H01L 43/06* (2013.01); *H01L 43/10* (2013.01)

(58) Field of Classification Search
    USPC ........................................................ 365/158
    See application file for complete search history.

(56) References Cited

U.S. PATENT DOCUMENTS

| | | | | |
|---|---|---|---|---|
| 10,601,371 | B2* | 3/2020 | Kiehl | H01L 43/10 |
| 10,916,282 | B2* | 2/2021 | Phung | H01L 27/222 |
| 2012/0018822 | A1 | 1/2012 | Gaudin et al. | |
| 2012/0036099 | A1* | 2/2012 | Venkatraman | G06N 3/049 706/27 |
| 2015/0269478 | A1* | 9/2015 | Datta | G11C 11/16 706/33 |
| 2016/0035404 | A1* | 2/2016 | Ohki | G11C 11/1657 365/158 |
| 2016/0142012 | A1* | 5/2016 | Wang | G11C 19/0841 331/94.1 |
| 2017/0077177 | A1* | 3/2017 | Shimomura | H01L 27/11582 |
| 2017/0178705 | A1* | 6/2017 | Buhrman | G11C 11/18 |
| 2017/0222135 | A1* | 8/2017 | Fukami | G11C 11/1675 |
| 2018/0019388 | A1* | 1/2018 | Fukami | H03K 19/18 |
| 2018/0033954 | A1* | 2/2018 | Aradhya | H01L 43/06 |
| 2018/0166500 | A1* | 6/2018 | Wang | H03K 19/18 |
| 2018/0219152 | A1* | 8/2018 | Apalkov | H01F 10/329 |
| 2018/0240896 | A1* | 8/2018 | Nikonov | G11C 11/223 |
| 2019/0058113 | A1* | 2/2019 | Ramaswamy | G11C 19/0841 |
| 2020/0013444 | A1* | 1/2020 | Min | G11C 11/161 |
| 2020/0106001 | A1* | 4/2020 | Gupta | H01L 43/12 |
| 2020/0312907 | A1* | 10/2020 | Ouellette | H01L 43/08 |
| 2020/0395532 | A1* | 12/2020 | Cai | H01F 10/329 |
| 2021/0050510 | A1* | 2/2021 | Cai | G11C 11/18 |
| 2021/0110857 | A1* | 4/2021 | Endoh | H01L 27/228 |

FOREIGN PATENT DOCUMENTS

| | | |
|---|---|---|
| JP | 2013541219 A | 11/2013 |
| WO | 2013025994 A2 | 2/2013 |
| WO | 2016159017 A1 | 10/2016 |
| WO | WO-2019159962 A1 * | 8/2019 ........... G11C 11/161 |

OTHER PUBLICATIONS

Borders, William A. et al., "Analogue spin-orbit torque device for artificial-neural-network-based associative memory operation", Applied Physics Express, Dec. 20, 2016, vol. 10, pp. 013007-1 to 013007-4.
International Search Report issued in PCT/JP2019/003165 dated Apr. 16, 2019.

* cited by examiner

APPLICATION CURRENT (ARBITRARY UNIT)

INPUT SIGNAL FREQUENCY (MHz)

MAGNETORESISTANCE EFFECT ELEMENT, CIRCUIT DEVICE, AND CIRCUIT UNIT

CROSS-REFERENCE TO RELATED APPLICATIONS

The present application is a U.S. National Phase of International Patent Application No. PCT/JP2019/003165, filed on Jan. 30, 2019, which claims the benefit and priority of Japanese Patent Application No. 2018-0019686 filed on Feb. 6, 2018. The contents of the above applications are incorporated herein by reference in their entirety.

TECHNICAL FIELD

The present invention relates to a magnetoresistance effect element, a circuit device, and a circuit unit.

BACKGROUND ART

A magnetic random access memory (MRAM) using a magnetoresistance effect element (also referred to as a magnetic tunneling junction (MTJ) element, or the like) has attracted attention.

Patent Literature 1 discloses a laminated body suitable for a three-terminal type MRAM. The laminated body has a structure in which a first external layer formed from a non-magnetic material, a center layer (recording layer) formed from a magnetic material, and a second external layer formed from a non-magnetic material are laminated. A reference layer formed from a magnetic material is stacked on the first external layer. In writing, a writing current parallel to the center layer is allowed to flow to the second external layer (conductive layer) to reverse a magnetization direction of the center layer. Note that, all of the magnetization direction of the center layer and a magnetization direction of the reference layer are perpendicular to an in-plane direction of the second external layer.

Patent Literature 2 also discloses a laminated body suitable for the three-terminal type MRAM. The laminated body has a structure in which a first external layer formed from a non-magnetic material, a center layer (recording layer) formed from a magnetic material, and a second external layer formed from a non-magnetic material are laminated. A reference layer is stacked on the first external layer. In writing, a writing current parallel to the center layer is allowed to flow to the second external layer (conductive layer) to reverse a magnetization direction of the center layer. Note that, all of the magnetization direction of the center layer and a magnetization direction of the reference layer are parallel to an in-plane direction of the second external layer and are perpendicular to an inflow direction of the writing current.

In Patent Literature 1 and Patent Literature 2, at least one of the first external layer and the second external layer is constituted by a non-magnetic metal. As a specific material of the non-magnetic metal, Pt, W, Ir, Ru, Pd, Cu, Au, Ag, Bi, and alloys thereof are disclosed.

On the other hand, there is known a neural network that performs information processing on a computer by using a brain mechanism of a living body as a model. In addition, in order to realize a neural network by using a semiconductor element or the like, research on constituent elements and circuits has been in progress.

CITATION LIST

Patent Literature

Patent Literature 1: US Unexamined Patent Application Publication No. 2012/0018822
Patent Literature 2: JP-T-2013-541219
Patent Literature 3: WO 2013/025994
Patent Literature 4: WO 2016/159017

SUMMARY OF INVENTION

Technical Problem

By the way, the magnetoresistance effect element is non-volatile, and is generally small in size and capable of performing high-speed writing. Therefore, for example, when the magnetoresistance effect element can be used as an element in a neuron circuit constituting the neural network as described above, or as a synapse element that determines a coupling weight between a pre-neuron circuit and a post-neuron circuit, a reduction in area, an improvement in processing speed, power saving, and the like are expected.

The invention has been made in consideration of the above-described circumstances, an object thereof is to provide a magnetoresistance effect element capable of being used as an element that constitutes a neural network or the like, and a circuit device and a circuit unit which use the magnetoresistance effect element.

Solution to Problem

To achieve the object, according to an aspect of the invention, there is provided a magnetoresistance effect element including: a channel layer that is formed from a material that does not have net magnetization, and extends in a first direction; a recording layer which includes a film formed from a ferromagnetic material, of which a magnetization state is changed to one of two or greater magnetization states, and which is formed on one surface of the channel layer; a non-magnetic layer that is provided on a surface of the recording layer which is opposite to the channel layer; a reference layer which is provided on a surface of the non-magnetic layer which is opposite to the recording layer, which includes a film formed from a ferromagnetic material, and of which a magnetization direction is fixed; a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and a third terminal that is electrically connected to the reference layer.

According to another aspect of the invention, there is provided a circuit device including: the magnetoresistance effect element; a pre-neuron circuit that is connected to the first terminal, and inputs the current pulse to the first terminal in synchronization with an firing timing; and a post-neuron circuit that is connected to the second terminal, and inputs the current pulse to the second terminal in synchronization with the firing timing.

According to still another aspect of the invention, there is provided a circuit unit including: the magnetoresistance effect element; and a pulse generation circuit that generates a pulse by detecting reversal of a magnetization direction of the magnetoresistance effect element from an initial state. A neuron circuit is connected to any one input terminal between the first terminal and the second terminal of the magnetoresistance effect element, and the current pulse is input to the one input terminal in synchronization with the firing timing of the neuron circuit.

Advantageous Effects of Invention

According to the invention, the magnetoresistance effect element can be used as an element that constitutes a neural network or the like. In addition, according to the invention, since the magnetoresistance effect element is used, it is possible to realize the neural network and various circuits such as a neuron circuit which are advantageous for a reduction in size, an improvement in processing speed, power saving, and the like.

DESCRIPTION OF EMBODIMENTS

First Embodiment

<Magnetoresistance Effect Element: Element Structure>

Figure 1:
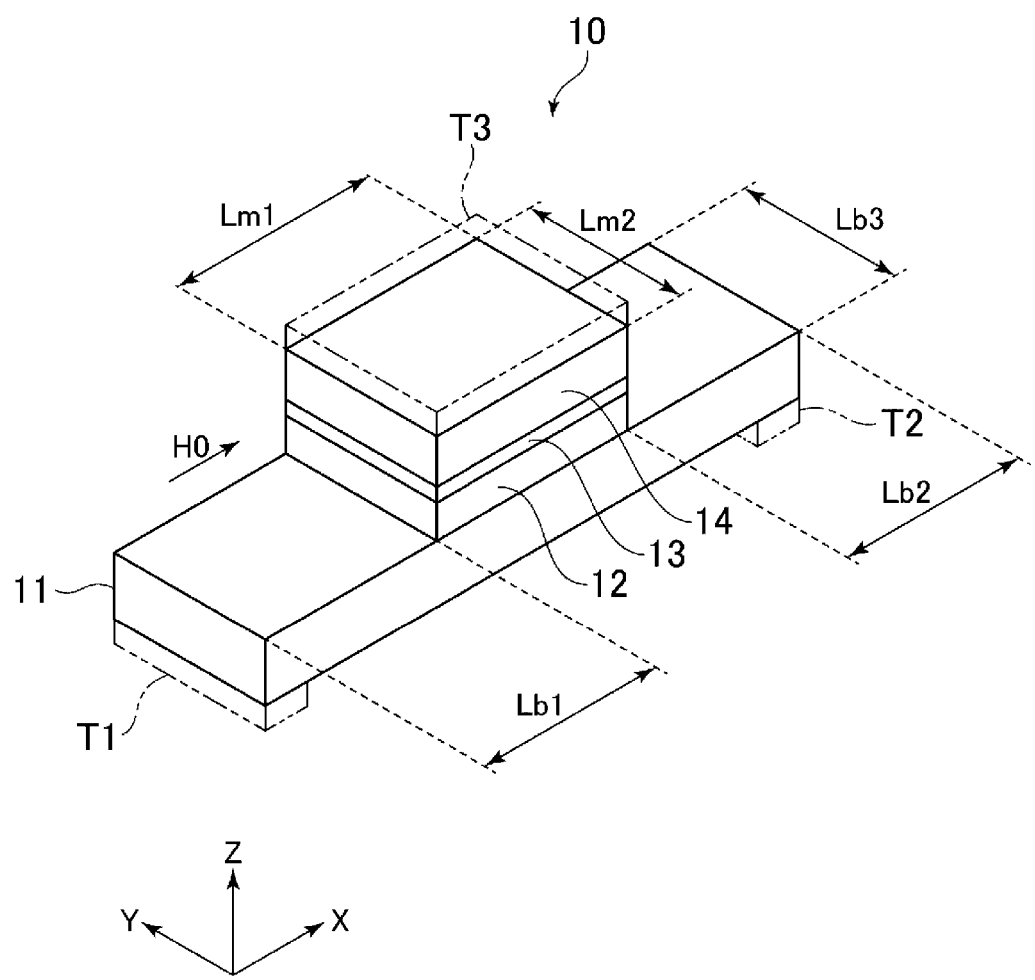
FIG. 1 is a perspective view illustrating an external appearance of a magnetoresistance effect element.

As illustrated in FIG. 1, a magnetoresistance effect element 10 has a configuration in which a channel layer 11, a recording layer 12, a non-magnetic layer 13, and a reference layer 14 are laminated in this order. In addition, a first terminal T1 and a second terminal T2 are provided in the channel layer 11, a third terminal T3 is provided in the reference layer 14, and the magnetoresistance effect element 10 has a three-terminal structure. The magnetoresistance effect element 10 in this example is a type in which the recording layer 12 is changed to any one between two magnetization states (hereinafter, referred to as a binary type). The first terminal T1 and the second terminal T2 may be electrically connected to the channel layer 11 through another conductive member or layer. Similarly, the third terminal T3 may be electrically connected to the reference layer 14 through another conductive member or layer.

In the following description, as illustrated in the drawings, a direction in which the channel layer 11, the recording layer 12, the non-magnetic layer 13, and the reference layer 14 are laminated is set as a Z-axis direction, and an X-axis direction, a Y-axis direction, and the Z-axis direction are set as directions perpendicular to each other. A direction of the magnetoresistance effect element 10 is not particularly limited. Accordingly, the recording layer 12 or the like may be disposed on a lower side of the channel layer 11.

The channel layer 11 is formed from a material that has conductivity and does not have net magnetization, has a predetermined thickness in the Z-axis direction, and has a plate shape that extends (is long) in the X-axis direction in this example. Examples of the material of the channel layer 11 which does not have the net magnetization include a non-magnetic material, an antiferromagnetic material, and the like. The channel layer 11 in this example is formed from the antiferromagnetic material, and a direction of each magnetic moment inside the antiferromagnetic material is set to a direction parallel to the extending direction (X-axis direction) of the channel layer 11. However, a structure of the magnetic moment inside the antiferromagnetic material may be a non-collinear structure in addition to a collinear structure as in this example. In a laminated structure including the channel layer 11 and the recording layer 12, a magnetization direction of the recording layer 12 is changed by spin orbit torque due to a spin current generated when a writing current is allowed to flow to the laminated structure, or the like. A flowing direction of the writing current is a longitudinal direction (X-axis direction) of the channel layer 11. Note that, in this example, the X-axis direction is a first direction. In addition, a shape of the channel layer 11 is not limited to a shape extending in one direction.

In an example, the channel layer 11 is an antiferromagnetic material formed from an alloy including at least one element selected from a first group consisting of Cr, Mn, Fe, Co, and Ni, and at least one element selected from a second group consisting of Ru, Rh, Pd, Ag, Os, Ir, Pt, and Au. Examples of the alloy that constitutes the channel layer 11 include a Pt—Mn alloy, and an Ir—Mn alloy. For example, in the case of the Pt—Mn alloy, with regard to a composition ratio thereof, in $Pt_XMn_{100-X}$, X is preferably 30 to 70, and for example, an alloy of $Pt_{40}Mn_{60}$ is preferable. In addition, in the case of the Ir—Mn alloy, with regard to a composition ratio thereof, in $Ir_XMn_{100-X}$, X is preferably 20 to 80.

In another example, the channel layer 11 is a non-magnetic material formed from an elementary metal of Hf, Ta, W, Ir, or Pt, or an alloy containing these metals as a main component.

For example, the channel layer 11 is formed in the following dimensions. Specifically, the thickness (a length in the Z-axis direction) is in a range of 1 to 15 nm and preferably 3 to 10 nm, a length in the X-axis direction is in a range of 40 to 920 nm and preferably 60 to 600 nm, and a width (a length in the Y-axis direction) is in a range of 15 to 150 nm and preferably 20 to 100 nm.

The channel layer 11 provides an exchange bias magnetic field to the recording layer 12. According to this, it can be regarded that a static magnetic field in the X-axis direction (hereinafter, referred to as static magnetic field Ho) is applied to the recording layer 12. An operation of the exchange bias magnetic field by the channel layer 11 will be described later.

The recording layer 12 is provided on apart of one surface of the channel layer 11, and is disposed at the center of the channel layer 11 in the X-axis direction in this example. The recording layer 12 is a layer including a film formed from a ferromagnetic material, and a magnetization state thereof is changeable. In this example, the recording layer 12 has an axis of easy magnetization (axis of easy perpendicular magnetization axis) in a direction (Z-axis direction) perpendicular to a film surface. However, the magnetization direction near an interface with the channel layer 11 may be tilted from the direction perpendicular to the film surface in a static state by the exchange bias from the channel layer 11 to be described later.

In this example, the recording layer 12 is laminated at the central portion on an upper surface of the channel layer 11, but the recording layer 12 may be laminated at the entirety of the upper surface of the channel layer 11. According to this configuration, it is easy to manufacture a magnetoresistance effect element. In addition, the recording layer 12 is laminated at the center in the longitudinal direction (X-axis direction) of the channel layer 11, but the recording layer 12 may be laminated at a position deviated from the center in the longitudinal direction of the channel layer 11.

In a magnetization state of the recording layer 12, Z-axis direction components of magnetization are changed between +Z-axis direction and −Z-axis direction by the spin orbit torque. In this example, the recording layer 12 becomes either a parallel state (first magnetization state) in which the Z-axis direction components of the magnetization are aligned, and faces the same direction as the magnetization of the reference layer 14, and an anti-parallel state (second magnetization state) in which the Z-axis direction components of the magnetization are directed to an opposite direction.

A configuration in which the recording layer 12 is formed on one surface of the channel layer 11 includes a configuration in which the channel layer 11 is formed to be adjacent or close to the recording layer 12 in addition to a configuration in which the recording layer 12 is formed directly on the one surface of the channel layer 11. Accordingly, the recording layer 12 and the channel layer 11 may be disposed through another layer, a space, or the like. This is also true of the other layers.

The recording layer 12 has a configuration including a film of a ferromagnetic material such as Fe, Co, and Ni. Specifically, a laminated structure of Co/Ni, Co/Pt, Co/Pd, Co/Au, or Fe/Au, alloys such as Co—Pt, Co—Cr—Pt, Co—Pd, Fe—Pt, Fe—Pd, Fe—Co—Pt, and Fe—Co—Pd, alloys such as CoFeB and FeB can be used. In addition, a laminated structure obtained by combining the above-described laminated structure and the alloys, for example, [Co/Ni]/Ta/CoFeB, and the like are also possible. Note that, notation of the above-described laminated structure represents a laminated structure obtained by laminating films formed from materials before and after "/", and in this example, a material on a front side of "/" is the channel layer 11 side. In addition, notation of an alloy including "-" represents an alloy containing elements coupled by "-" as components, and may contain other elements. This is also true of notation of the following laminated structure and alloy.

The recording layer 12 is formed in the following dimensions. Specifically, the thickness is in a range of 0.8 to 5 nm and preferably 1 to 3 nm, a length in the X-axis direction is in a range of 10 to 120 nm and preferably 20 to 100 nm, and a width is in a range of 10 to 120 nm and preferably 20 to 100 nm.

The non-magnetic layer 13 is provided on a surface of the recording layer 12 which is opposite to the channel layer 11, and is formed from, for example, a non-magnetic material such as MgO, $Al_2O_3$, and AlN having insulation properties. In this case, for example, the non-magnetic layer 13 is formed in a thickness in a range of 0.1 to 5 nm and preferably 0.5 to 2.5 nm. Note that, the non-magnetic layer 13 may be formed from a non-magnetic material such as Cu and Al having conductivity.

The reference layer 14 is a layer including a film formed form a ferromagnetic material, and a magnetization direction thereof is fixed. The magnetization direction of the reference layer 14 is fixed to the +Z-axis direction or the −Z-axis direction. Fixing of the magnetization direction of the reference layer 14 includes the case of substantial fixing. That is, in the reference layer 14, the magnetization direction may fluctuate in a range in which a read-out operation using a tunnel magnetoresistance effect is not influenced by the fluctuation. In a case where the reference layer 14 is provided on a surface of the non-magnetic layer 13 which is opposite to the recording layer 12, and the non-magnetic layer 13 is constituted by an insulating material, the non-magnetic layer 13 is interposed between the recording layer 12 and the non-magnetic layer 13 to form a magnetic tunnel junction (MTJ). Note that, in a case where the non-magnetic layer 13 is constituted by a conductive material, a giant magnetoresistance effect (GMR) element structure is formed.

In this example, the first terminal T1 and the second terminal T2 are provided on a surface of the channel layer 11 which is opposite to the recording layer 12, and is electrically connected to the channel layer 11. The first terminal T1 and the second terminal T2 are disposed in an XY-plane at positions at which the recording layer 12 is interposed between the terminals with an interval in the X-axis direction. In this example, the first terminal T1 and the second terminal T2 are respectively disposed at end portions in a longitudinal direction of the channel layer 11. An external circuit (not illustrated) is connected to the first terminal T1 and the second terminal T2, and a current pulse is input from the external circuit to either the first terminal T1 or the second terminal T2. That is, the first terminal T1 and the second terminal T2 constitute an input terminal pair. Note that, the first terminal T1 and the second terminal T2 are provided on the surface of the channel layer 11 which is opposite to the recording layer 12, but may be formed on any surface of the channel layer 11.

When a current pulse is input to one of the first terminal T1 and the second terminal T2 from the external circuit, a writing current flows in the channel layer 11 from the one terminal toward the other terminal. According to this, a magnetization state of the recording layer 12 is changed due to spin orbit torque. The writing current is set to flow in the +X-axis direction when a current pulse (first current pulse) is input to the first terminal T1, and flows to the −X-axis direction when a current pulse (second current pulse) is input to the second terminal T2. Accordingly, the recording layer 12 can be set to either a parallel state or an anti-parallel state by a direction of the writing current.

The third terminal T3 constitutes an output terminal pair that outputs a read-out current corresponding to a magnetization state of the recording layer with both or any one of the first terminal T1 and the second terminal T2 (in this example, the second terminal T2). In this example, when determining the magnetization state of the recording layer 12, the output terminal pair applies a voltage between the second terminal T2 and the third terminal T3, and allows the read-out current to flow along a route ranging from the channel layer 11 to the reference layer 14 through the recording layer 12 and the non-magnetic layer 13. The magnetization state (the parallel state or the anti-parallel state) of the recording layer 12 is obtained by determining "high" and "low" (high resistance or low resistance) of resistance (tunnel resistance) between the reference layer 14 and the channel layer 11 from the application voltage and the read-out current. The resistance between the channel layer 11 and the reference layer 14 is changed from a relatively high-resistance state to a relatively low-resistance state in correspondence with the magnetization state of the recording layer 12.

The "high" and "low" of the resistance between the reference layer 14 and the channel layer 11 can also be determined from a voltage that is output after applying a predetermined current between the second terminal T2 and the third terminal T3.

<Shape>

A length $Lm1$ of the recording layer 12, the non-magnetic layer 13, and the reference layer 14 in the X-axis direction is typically set within a range of 20 to 1000 nm. A length $Lm2$ of the recording layer 12, the non-magnetic layer 13, and the reference layer 14 in the Y-axis direction is typically set within a range of 20 to 1000 nm. In an XY plane, a length $Lb1$ and a length $Lb2$ in the X-axis direction in a region in which the channel layer 11 does not overlap the recording layer 12, the non-magnetic layer 13, and the reference layer 14 is typically set within a range of 0 to 600 nm. A length $Lb3$ of the channel layer 11 in the Y-axis direction is typically set within a range of 20 to 1000 nm. It is preferable that a magnitude relationship of the lengths $Lm1$, $Lm2$, $Lb1$, $Lb2$, and $Lb3$ satisfy respective relationships of $Lm1\sim Lm2$, $Lm2 \leq Lb3$, and $Lm1 < \sim Lb1 \sim Lb2$. Note that, the symbol "~" represents approximately the same, and represents that when one length between lengths coupled by "~" is set as a reference, the other length is within, for example, a range of ±50% of the one length. In addition, the symbol "<~" represents that a value on the right side is approximately the same as or greater than a value on the left side. For example, when the value on the right side is equal to or greater than −50% of the value of the left side, it is assumed that the value on the right side is approximately the same as the value on the left side.

With regard to shapes in the XY plane, the channel layer 11 is set to a rectangular shape, and the recording layer 12, the non-magnetic layer 13, and the reference layer 14 are set to a square shape. However, there is no limitation to the shapes. For example, the shape of the recording layer 12, the non-magnetic layer 13, and the reference layer 14 in the XY plane may be appropriately determined to a circle, an ellipse, a parallelogram, a rhombus, or a hexagon so that a preferred device operation is obtained.

It is not necessary to set the Y-axis direction, which is a short-side direction of the channel layer 11, as a longitudinal direction of the recording layer 12, and thus it is possible to further reduce a cell area in comparison to a configuration in which a longitudinal direction of the channel layer and a longitudinal direction of the recording layer are set to an approximately vertical (a configuration in which the writing current and the magnetization direction of the recording layer are perpendicular).

The channel layer 11 to the reference layer 14 are sequentially deposited on a substrate (not illustrated), for example, by an ultra-high vacuum sputtering method, or the like. The channel layer 11 to the reference layer 14 may be subjected to a heat treatment in a magnetic field. As treatment conditions, for example, a temperature is 300° C. to 400° C., a holding time is two hours, and a magnetic flux density is 1.2 T. The magnetic field is set to a direction within ±45° with respect to an extension direction of the channel layer 11 (longitudinal direction, X-axis direction), and preferably within ±30°. Through the treatment, in a case where an antiferromagnetic material is used for the channel layer 11, a direction of magnetic moment can be aligned, and an internal magnetic field can be applied to an adjacent ferromagnetic material of the recording layer 12 by an exchange bias. Then, a deposited film is patterned to an appropriate shape by a lithography technology or the like. A magnetization direction of the reference layer 14 is set to a desired direction by material-specific magnetic anisotropy, and magnetic field application after manufacturing an element. Note that, the channel layer 11 to the reference layer 14 may be deposited in a magnetic field with a predetermined magnetic flux density without performing the heat treatment, and the resultant deposited film may be patterned.

<Element Operation>

Description will be given of an operation in a case where the magnetoresistance effect element 10 configured as described above is used as a memory of one bit data (data "1" or "0"). One bit data of "0" and "1" is allocated to the magnetization state of the recording layer 12, that is, a resistance state in advance. For example, a high-resistance state is allocated to "1", and a low-resistance state is allocated to "0" in advance. That is, "1" is allocated to the parallel state of the recording layer 12, and "0" is allocated to the anti-parallel state. Note that, in the following description, with regard to the magnetization direction of the recording layer 12, only a component in the Z-axis direction will be described or illustrated for simplification of description.

When reading out data from the magnetoresistance effect element 10, a voltage determined in advance is applied between the second terminal T2 and the third terminal T3. In the recording layer 12 illustrated in FIG. 2(A), a direction of magnetization M12 is the +Z-axis direction, and is in an anti-parallel state in which the direction is opposite to a direction of magnetization M14 of the reference layer 14 in the −Z-axis direction. Accordingly, the magnetoresistance effect element 10 is in a high-resistance state in which resistance of a current path between the reference layer 14 and the recording layer 12 is relatively large. According to this, a read-out current is relatively small. On the other hand, in the recording layer 12 illustrated in FIG. 2(B), the direction of the magnetization M12 is the −Z-axis direction, and is in a parallel state in which the direction is the same as the direction of the magnetization M14 of the reference layer 14. According to this, the magnetoresistance effect element 10 is in a low-resistance state in which the resistance of the current path between the reference layer 14 and the recording layer 12 is relatively small. According to this, the read-out current is relatively large.

A resistance state of the current path ranging from the reference layer 14 to the recording layer 12 is determined from the magnitude of the application voltage and the read-out current, and one bit data is specified from the resistance state. Note that, allocation of the one bit data and the resistance state may be inverted from each other. In addition, the read-out current may flow in a direction penetrating through the magnetic tunnel junction including the recording layer 12, the non-magnetic layer 13, and the reference layer 14, and thus the direction may be a direction in which the read-out current flows from the channel layer 11 to the reference layer 14, or the opposite direction.

When writing data in the magnetoresistance effect element 10, a pulse-like writing current Iw is allowed to flow to a laminated structure including the channel layer 11 and the recording layer 12 by using the first terminal T1 and the second terminal T2. The writing current Iw may flow to only the channel layer 11, or may flow to both the channel layer 11 and the recording layer 12. In a case where magnetization reversal of the recording layer 12 is induced by a spin hall effect as to be described later, it is necessary to introduce a current to the channel layer 11, and in this case, the writing current Iw is allowed to flow to at last the channel layer 11. On the other hand, in a case where magnetization reversal is induced by a Rashba-Edelstein effect, it is necessary to introduce a current to an interface of a laminated film, and in this case, the writing current Iw is allowed to flow to both the channel layer 11 and the recording layer 12. As in this example, in a configuration in which the recording layer 12 is formed directly on the surface of the channel layer 11, since the channel layer 11 and the recording layer 12 are respectively conductors, when a current is allowed to flow to the channel layer 11, the current also flows to the recording layer 12. In addition, the current also flows to an interface of the layers. Note that, in a case where it is not necessary to particularly discriminate the both cases, description will be given with notation as "the writing current Iw is allowed to flow to the channel layer 11" or the like in any case for simplification of description.

Figure 2:
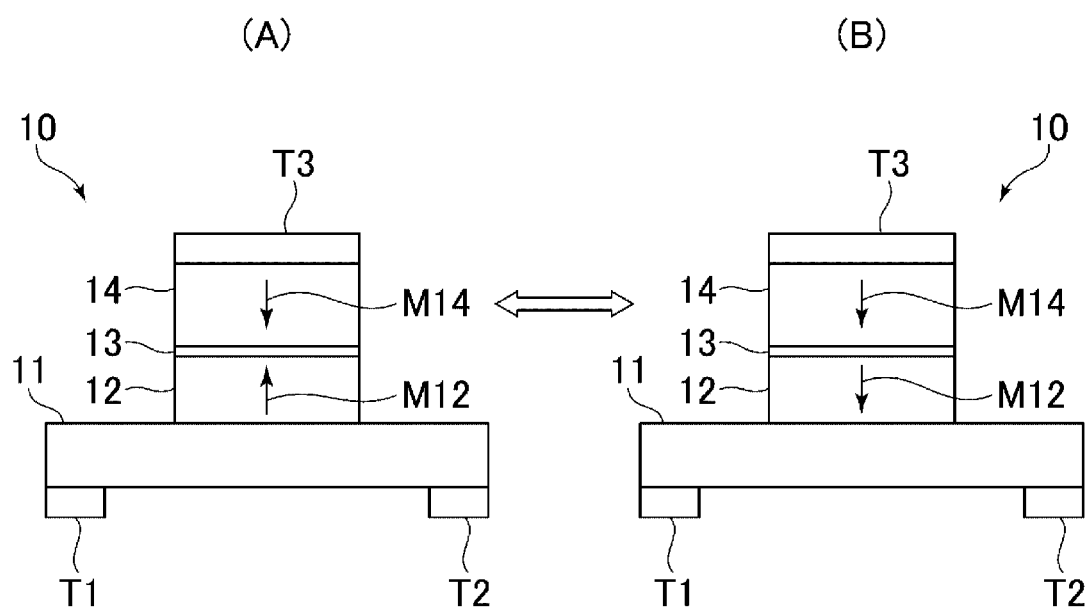
FIG. 2 is a view illustrating a variation of magnetization of a recording layer of the magnetoresistance effect element.

When writing data "0" in the magnetoresistance effect element 10 that stores data "1", for example, a current pulse is input to the first terminal T1, and a writing current Iw in the +X-axis direction which is directed from the first terminal T1 to the second terminal T2 is allowed to flow to the channel layer 11. When the writing current Iw flows to the channel layer 11, for example, a spin current Js in the −Z-axis direction is generated in the channel layer 11 due to a spin hall effect or the like. According to this, a polarized spin is accumulated in the recording layer 12, spin orbit torque operates on the magnetization M12 of the recording layer 12, the magnetization M12 of the recording layer 12 rotates from the anti-parallel state facing the +Z-axis direction as illustrated in FIG. 2(A), and is reversed to the parallel state facing the −Z-axis direction as illustrated in FIG. 2(B). As a result, the magnetoresistance effect element 10 enters a low-resistance state. According to this, the memory data "1" in the magnetoresistance effect element 10 is rewritten to "0".

On the other hand, when writing data "1" in the magnetoresistance effect element 10 that stores data "0", a current pulse is input to the second terminal T2, and a writing current Iw in the −X-axis direction which is directed from the second terminal T2 to the first terminal T1 is allowed to flow to the laminated structure including the channel layer 11 and the recording layer 12. In this case, a spin current Js in the +Z-axis direction is generated in the channel layer 11 due to a spin hall effect or the like. As described above, a polarized spin is accumulated, and the spin orbit torque operates on the magnetization M12 of the recording layer 12. According to this, the magnetization M12 of the recording layer 12 rotates from the parallel state facing the −Z-axis direction as illustrated in FIG. 2(B), and is reversed to the anti-parallel state facing the +Z-axis direction as illustrated in FIG. 2(A). As a result, the magnetoresistance effect element 10 enters a high-resistance state, and the memory data is rewritten to "1".

Here, description has been given with the spin hall effect set as the origin of the spin orbit torque, but the origin of the spin orbit torque may be derived by another effect. For example, the Rashba-Edelstein effect is also possible. In this case, when a Rashba effective magnetic field operates on electrons flowing along an interface between the channel layer 11 and the recording layer 12, a polarized spin is accumulated, and the polarized spin operates on the magnetization M12 of the recording layer 12, and magnetization reversal is induced.

In any case, the direction of the magnetization M12 of the recording layer 12 is maintained even after the writing current Iw become "0", and thus data is stored in the magnetoresistance effect element 10 in a non-volatile manner. When "positive and negative" of a current flowing to the channel layer 11 is set to "positive and negative" of the X-axis direction, a pulse height (current value) of the writing current Iw when writing data "1" is equal to or less than a threshold IC1 (<0) to be described later, and a pulse height of the writing current Iw when writing data "0" is equal to or greater than a threshold IC0 (>0) to be described later. In addition, a pulse width of the writing current Iw is time equal to or longer than time necessary for data rewriting, and in this example, the pulse width is time shorter than 20 microseconds, and for example, the pulse width is equal to or longer than 0.1 nanoseconds and shorter than 5 microseconds.

In the case of flowing the writing current Iw for writing the same data stored in the magnetoresistance effect element 10, data rewriting does not occur. In addition, a relationship of the direction of the writing current Iw, the spin current, and the direction of the spin orbit torque is an example, the spin current and the direction of the spin orbit torque with respect to the direction of the writing current Iw is changed in accordance with materials used for the channel layer 11, the recording layer 12, and the non-magnetic layer 13, and a combination thereof. Accordingly, a direction of the writing current Iw with respect to data to be stored is determined on the basis of the materials used for the channel layer 11, the recording layer 12, and the non-magnetic layer 13, and a combination thereof.

Figure 3:
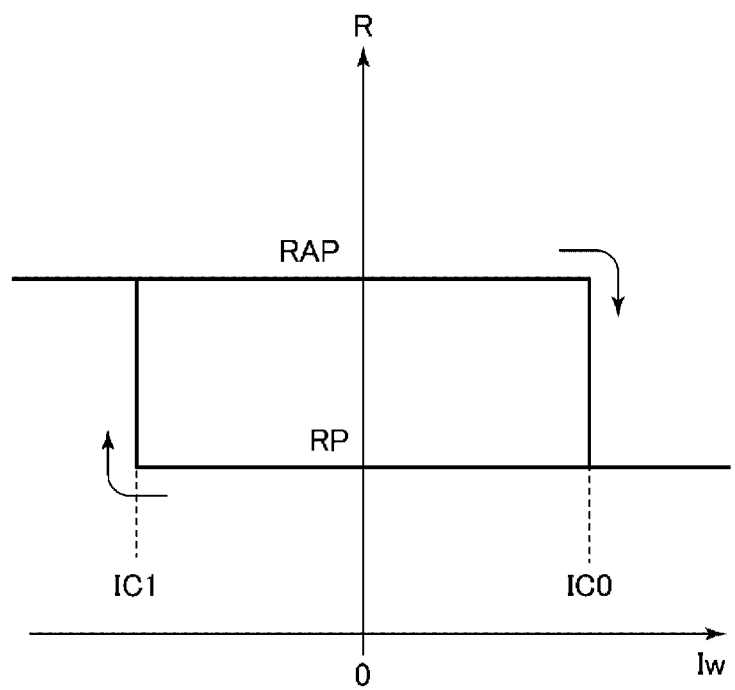
FIG. 3 is a graph showing a relationship between a writing current and resistance of the magnetoresistance effect element.

An example of a relationship between the writing current Iw, and resistance R between the channel layer 11 and the reference layer 14 is shown in FIG. 3. When the writing current Iw equal to or less than the threshold IC1 flows, the direction of the magnetization M12 of the recording layer 12 is opposite to the direction of the magnetization M14 of the reference layer (anti-parallel state), and the resistance R becomes a relatively large value RAP. On the other hand, when the writing current Iw equal to or greater than the threshold IC0 flows, the direction of the magnetization M12 of the recording layer 12 becomes the same as the direction of the magnetization M14 of the reference layer 14 (parallel state), and thus the resistance R becomes a relatively small value RP. Absolute values of the thresholds IC1 and IC0 of the writing current Iw at which data rewriting occurs are approximately the same as each other.

Figure 4:
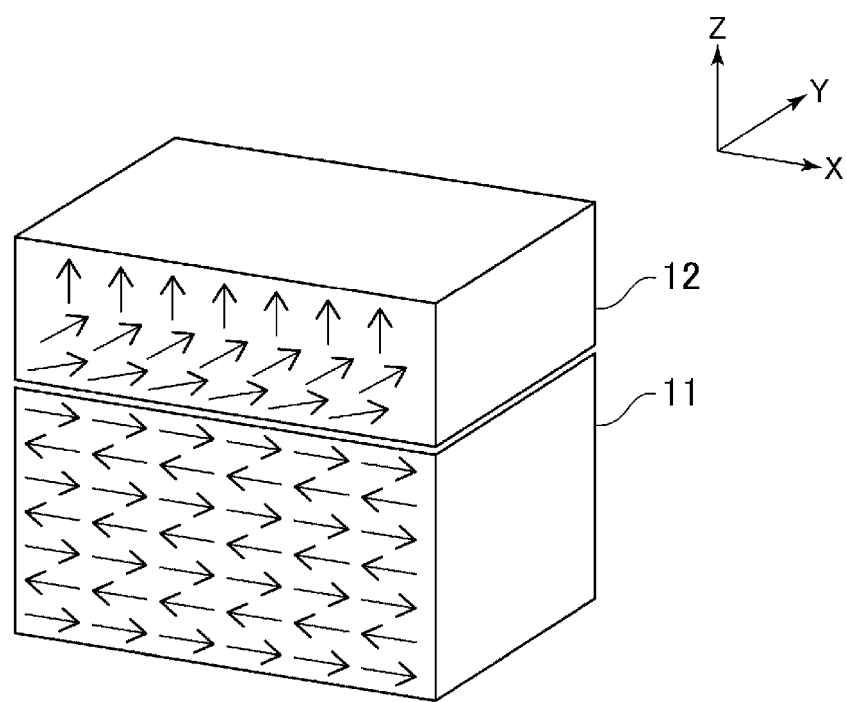
FIG. 4 is a view illustrating an operation of an exchange bias.

Next, the operation of the exchange bias magnetic field in a case where an antiferromagnetic material is used for the channel layer 11 will be described with reference to FIG. 4. A magnetic order in which adjacent magnetic moments are in opposite directions exists inside the channel layer 11 that is an antiferromagnetic material. When the channel layer 11 is made to be close to the recording layer 12 that is a ferromagnetic material, a unidirectional exchange bias magnetic field operating from the channel layer 11 operates on the magnetization M12 of the recording layer 12. In this manner, an operation of a magnetic field of an antiferromagnetic material on a ferromagnetic material is referred to as "exchange bias". Due to the exchange bias, a magnetization of the ferromagnetic material rotates in a direction of a magnetic moment of the antiferromagnetic material in the vicinity of an interface of the antiferromagnetic material, and faces a direction of an axis of easy magnetization of the ferromagnetic material as being spaced apart from the antiferromagnetic material. In this example, the magnetic moment of the channel layer 11 is in an in-plane direction, and the recording layer 12 has an axis of perpendicular easy magnetization, and thus an exchange bias in an in-plane direction operates on the recording layer 12, the magnetization of the recording layer 12 rotates in the in-plane direction in the vicinity of an interface with the channel layer 11, and faces a vertical direction as being spaced apart from the antiferromagnetic material.

In this manner, since the exchange bias from the channel layer 11 operates on the recording layer 12, it is not necessary to additionally provide a mechanism for applying an external magnetic field to the recording layer 12. According to this, in a recording device employing the magnetoresistance effect element 10, or the like, the configuration can be further simplified in comparison to a configuration including the mechanism for application of the external magnetic field.

Figure 5:
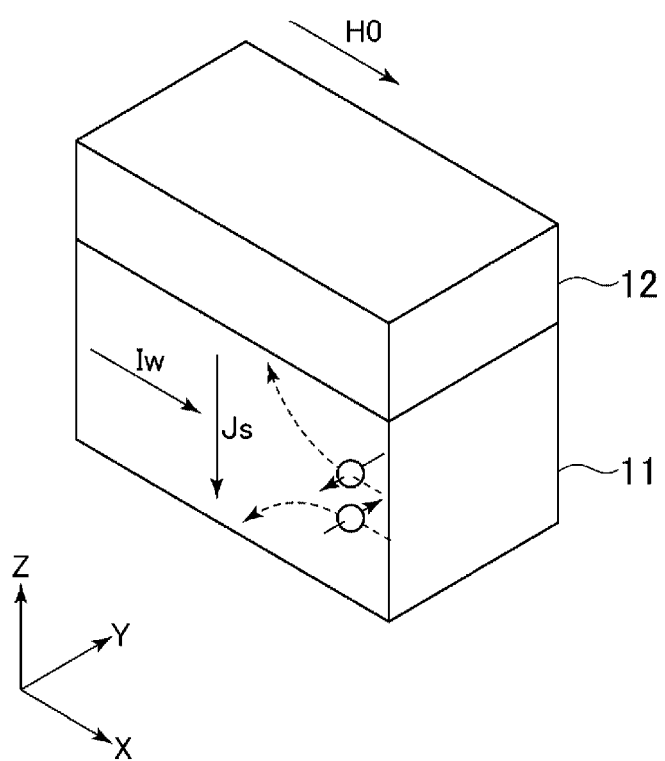
FIG. 5 is a view illustrating a spin current causing spin orbit torque to operate.

Next, description will be given of the principle of reversal of the direction of the magnetization M12 of the recording layer 12 due to the spin orbit torque as described above. Here, description will be given of a mechanism of reversal of the direction of the magnetization M12 of the recording layer 12 in a case where the spin orbit torque operates due to a spin hall effect. In addition, for simplification, it is assumed that the magnetization is reversed along a trajectory in a quasi-static process. FIG. 5 schematically illustrates a flow of a spin current Js when a writing current Iw in the +X-axis direction flows to the channel layer 11. When the writing current Iw flows in the +X-axis direction, electrons in which a spin is polarized in the +Y-axis direction are scattered in the −Z-axis direction, and electrons in which a spin is polarized in the −Y-axis direction are scattered in the +Z-axis direction. According to this, electrons in which a spin is polarized in the −Y-axis direction are accumulated in the recording layer 12. Note that, a current symbol (current direction), and a polarized spin scattering direction or a size thereof are determined by a symbol of a spin hall angle, and may be opposite to the above description. The above description is based on a relationship between a current direction and a spin scattering direction in a case where the spin hall angle is positive.

Electrons in which a spin is polarized in the −Y-axis direction exert torque in a direction of the magnetization M12 of the recording layer 12. This is the spin orbit torque. The spin orbit torque has two types of operations which can be represented by a vertical effective magnetic field and a transverse effective magnetic field, respectively. The vertical effective magnetic field corresponds to Slonczewski torque as the type of torque, and the transverse effective magnetic field corresponds to field-like torque.

FIGS. 6(A) to 6(D) schematically illustrate directions of a vertical effective magnetic field H1 and a transverse effective magnetic field H2 when the magnetization M12 of the recording layer 12 faces four directions. The transverse effective magnetic field H2 always faces the +Y-axis direction. On the other hand, the vertical effective magnetic field H1 faces a direction in which the direction of the magnetization M12 is rotated in an XZ-plane. Note that, the directions of the vertical effective magnetic field H1 and the transverse effective magnetic field H2 are changed by a combination of materials used.

Figure 6:
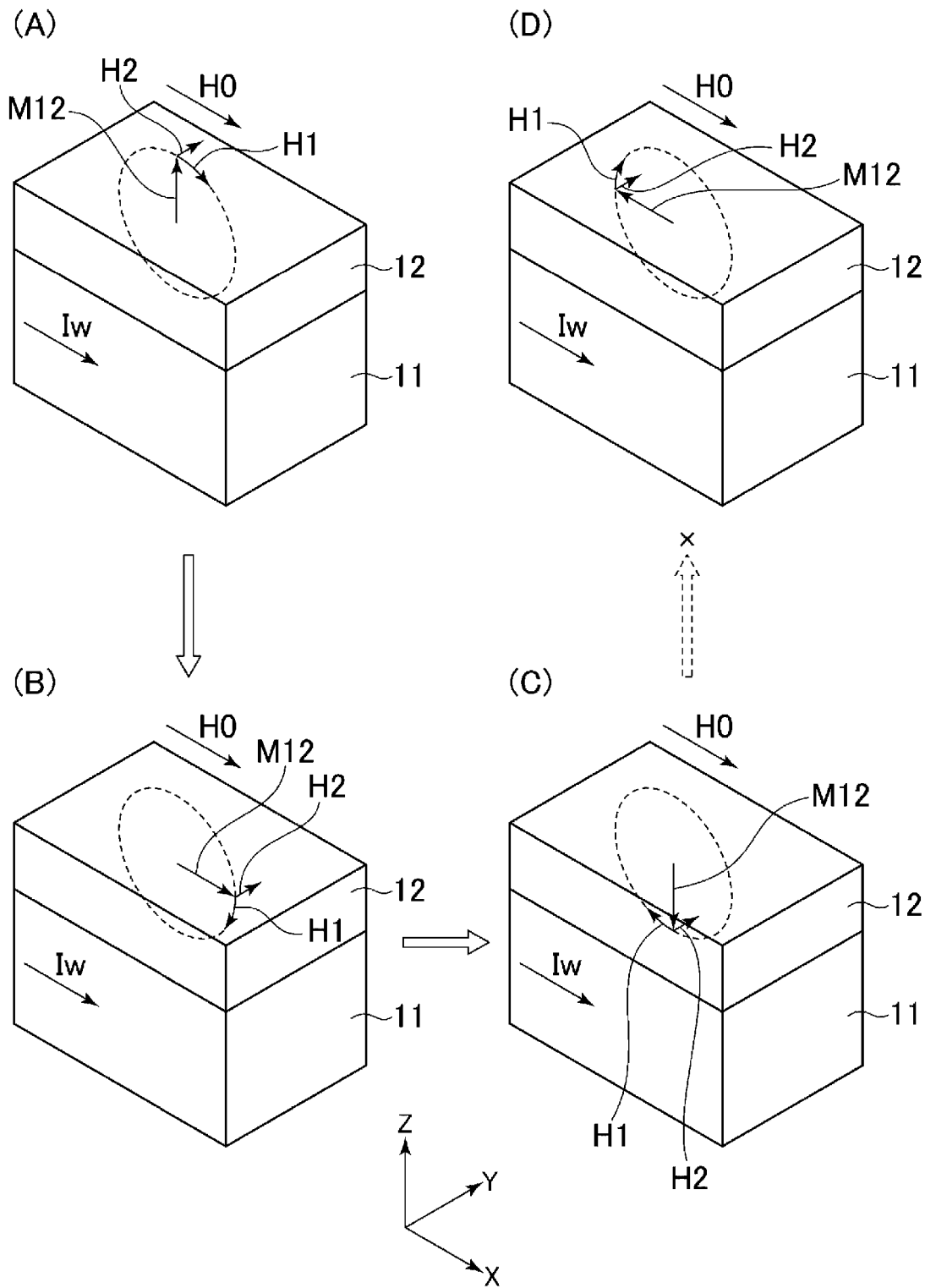
FIG. 6 is a view illustrating rotation of a magnetization direction due to the spin orbit torque.

Here, as illustrated in FIG. 6(A), it is assumed that a static magnetic field Ho in the +X-axis direction due to the channel layer 11 operates on the recording layer 12. In a case where a writing current Iw flows in the +X-axis direction, due to the vertical effective magnetic field H1 by a spin current Js accompanying the flowing, the magnetization M12 rotates from a state in which the magnetization M12 faces the +Z-axis direction as illustrated in FIG. 6(A) to a state in which the magnetization M12 faces the −Z-axis direction as illustrated in FIG. 6(C) through a state in which the magnetization M12 faces the +X-axis direction as illustrated in FIG. 6(B). In the state illustrated in FIG. 6(C), the vertical effective magnetic field H1 operates in the −X-axis direction, but the static magnetic field Ho operates in the +X-axis direction, and thus further rotation of the direction does not occur in the magnetization M12. Accordingly, the state illustrated in FIG. 6(C) becomes a final state.

On the other hand, in the state illustrated in FIG. 6(C), in a case where the writing current Iw flows to the channel layer 11 in a direction opposite to the direction, the vertical effective magnetic field H1 faces the opposite direction. According to this, the magnetization M12 is changed from the state illustrated in FIG. 6(C) to the state illustrated in FIG. 6(A) through the state illustrated in FIG. 6(B), and this state becomes a final state.

In a case where the static magnetic field Ho faces the −X-axis direction, the magnetization M12 is changed to the state illustrated in FIG. 6(A) and the state illustrated in FIG. 6(C) through the state illustrated in FIG. 6(D) without through the state illustrated in FIG. 6(B), and the magnetization M12 can be stabilized to the state illustrated in FIG. 6(A) or the state illustrated in FIG. 6(C) in correspondence with the direction of the writing current Iw.

Description has been given on the basis of the spin hall effect. However, even in the Rashba-Edelstein effect, both the vertical effective magnetic field H1 and the transverse effective magnetic field H2 operate on the magnetization M12, and a reversal process of the magnetization direction is the same as described above. In addition, even in an effect other than the spin Hall effect or the Rashba-Edelstein effect it is possible to control the magnetization direction by the mode described here as long as the vertical effective magnetic field H1 is generated by a current.

The magnetoresistance effect element 10 of this embodiment is common to the magnetoresistance effect element disclosed in Patent Literature 1 in that a spin in an in-plane direction perpendicular to the magnetization direction is injected into the recording layer, and is different from the magnetoresistance effect element disclosed in Patent Literature 2 in that a spin parallel or anti-parallel to the magnetization direction is injected to the recording layer. In a case where the spin in the parallel or anti-parallel direction is injected into the recording layer, the magnetization direction of the recording layer is reversed due to a processional motion. According to this, a large current is necessary to cause magnetization direction reversal in a nanosecond region. On the other hand, in a case where a spin in the perpendicular direction is injected into the recording layer, an increase of a threshold current in a nanosecond region is small, and this is suitable for realizing a high-speed operation (refer to Applied Physics Letters, Vol. 104, 072413 (2014)). According to the configuration in the embodiment, since information is rewritten in the vertical effective magnetic field, rewriting is possible in a pulse width of equal to or longer than 0.1 nanoseconds and shorter than 10 nanoseconds, and thus high-speed rewriting performance is obtained. Note that, even in a range in which the pulse width of the writing current Iw is set to 10 nanoseconds to 30 nanoseconds, it is possible to secure a rewriting speed comparable to the rewriting by injection of the spin in the parallel or anti-parallel direction in the related art.

MODIFICATION EXAMPLE

The configuration of the magnetoresistance effect element is an example, and there is no limitation thereto. Hereinafter, another configuration of the magnetoresistance effect element will be described, but the configuration is the same as in the magnetoresistance effect element 10 except for the following detailed description. Accordingly, the same reference numeral will be given to the same constituent member, and description thereof will be omitted.

Figure 7:
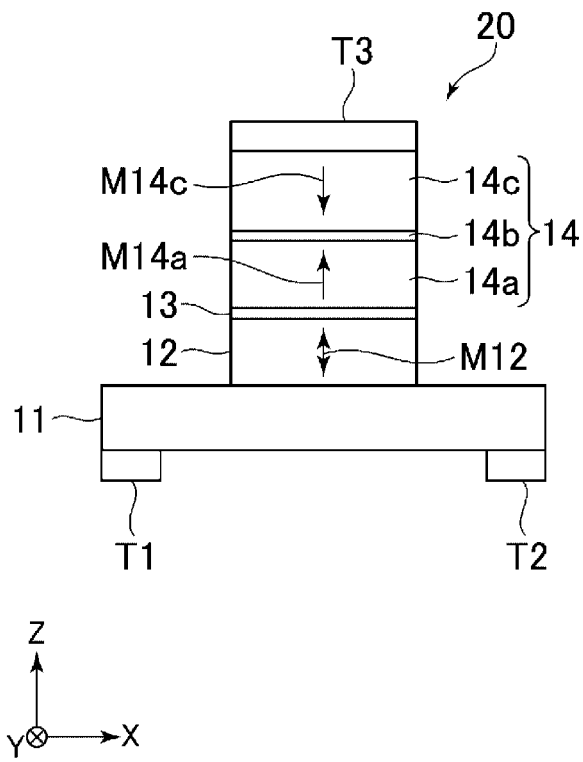
FIG. 7 is a view illustrating a configuration of the magnetoresistance effect element in which a reference layer is set to a laminated ferri structure.

FIG. 7 illustrates a configuration in which the reference layer 14 is set to a laminated ferri structure. The reference layer 14 of a magnetoresistance effect element 20 has the laminated ferri structure in which a ferromagnetic layer 14a, a non-magnetic coupling layer 14b, and a ferromagnetic layer 14c are laminated, and the ferromagnetic layer 14a and the ferromagnetic layer 14c are coupled by the coupling layer 14b in an antiferromagnetic manner. It is preferable to use a ferromagnetic material including Fe, Co, and Ni for the ferromagnetic layer 14a and the ferromagnetic layer 14c. In addition, it is preferable to use a material such as Ru, Ir, and Rh which exhibit an RKKY interaction for the coupling layer 14b. Examples of a preferred laminated structure of the laminated ferri structure include CoFeB/Ta/[Co/Pt]/Ru/[Co/Pt], and the like.

According to the configuration, when a direction of the magnetization M12 of the recording layer 12 and a direction of magnetization M14a of the ferromagnetic layer 14a, which is close to the recording layer 12, between the ferromagnetic layers 14a and 14c constituting the reference layer 14 match each other, this state is a parallel state and it enters a low-resistance state. On the other hand, when the direction of the magnetization M12 of the recording layer 12 and the direction of the magnetization M14a of the ferromagnetic layer 14a are opposite to each other, this state is an anti-parallel state, and it enters a high-resistance state. It is effective to stabilize the magnetization of the reference layer 14 by setting the reference layer 14 to the laminated ferri structure so as to perform stable writing and reading-out.

In the magnetoresistance effect element, it is preferable that the recording layer has excellent characteristics in the following two points. A first point relates to writing, and it is preferable to reverse a direction of magnetization with a small current and a short pulse width. A second point relates to reading-out, it is preferable that a tunnel magnetoresistance effect (TMR) ratio, which corresponds to a resistance difference between parallel/anti-parallel states of magnetization when flowing a current between the recording layer, the non-magnetic layer, and the reference layer, is great.

Figure 8:
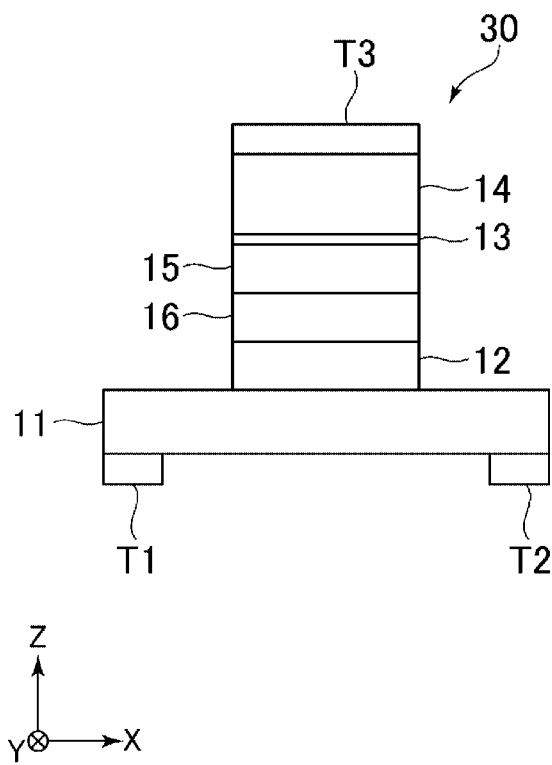
FIG. 8 is a view illustrating a configuration of the magnetoresistance effect element in which a sensor layer and a conductive layer are provided between the recording layer and a non-magnetic layer.

As described above, in order to independently design both a read-out characteristic and a write characteristic, and to obtain satisfactory characteristics, a sensor layer 15 and a conductive layer 16 may be provided between the recording layer 12 and the non-magnetic layer 13 as in a magnetoresistance effect element 30 illustrated in FIG. 8. When the sensor layer 15 and the conductive layer 16 are provided, the sensor layer 15 may be designed so that the TMR ratio increases. On the other hand, the recording layer 12 may be designed so that the write characteristic is improved. That is, independent design is possible, and manufacturing easiness is enhanced. Note that, the sensor layer 15 and the recording layer 12 are coupled in a magnetic manner. As a coupling type, for example, static magnetic interaction can be used.

The sensor layer 15 is a layer for sensing magnetization of the recording layer 12, and an axis of easy magnetization thereof is perpendicular to a film surface as in the recording layer 12. A material excellent in the read-out characteristic is used for the sensor layer 15. The conductive layer 16 is a layer for electrically connecting the recording layer 12 and the sensor layer 15. A material compatible with the materials of the recording layer 12 and the sensor layer 15 is used for the conductive layer 16. In a case where a Co/Ni laminated film is used for the recording layer 12, Ta or the like can be used for the conductive layer 16.

A magnetic field is leaked form the recording layer 12 due to reversal in the magnetization direction of the recording layer 12, and the leaked magnetic field is transferred to the sensor layer 15 through the conductive layer 16. A magnetization direction of the sensor layer 15 is vertically reversed in response to the magnetic field. When reading out data from the recording element, the magnetization direction of the sensor layer 15 for which a material excellent in the read-out characteristic is used may be detected. In this manner, when the sensor layer 15 and the conductive layer 16 are added, both the read-out characteristic and the write characteristic can be satisfactory.

Figure 9:
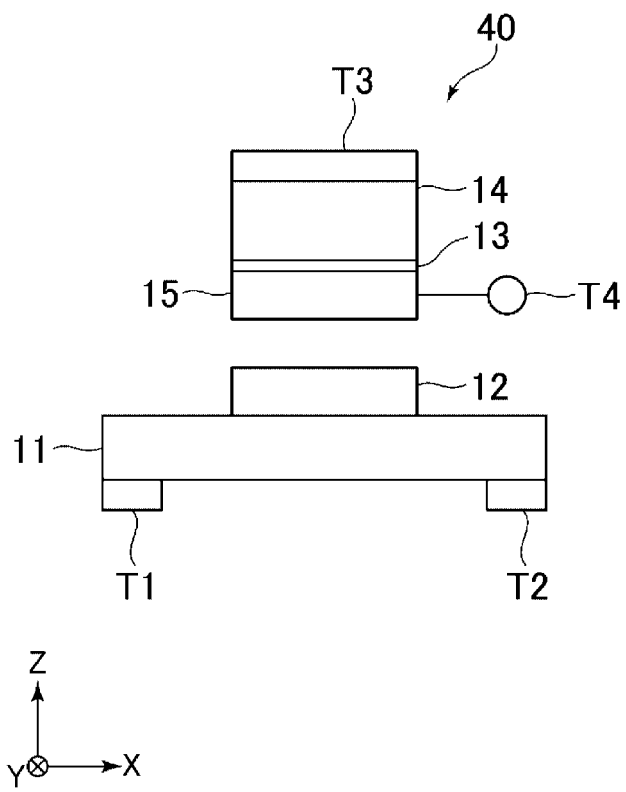
FIG. 9 is a view illustrating a configuration of the magnetoresistance effect element in which a sensor layer is provided between the recording layer and the non-magnetic layer.

In addition, only the sensor layer 15 may be added as in a magnetoresistance effect element 40 illustrated in FIG. 9. Even in this case, similarly to the example illustrated in FIG. 8, the recording layer 12 can be designed by specifying only the write characteristic. In addition, the read-out characteristic also becomes satisfactory due to the sensor layer 15. The magnetoresistance effect element 40 has a four-terminal structure in which a fourth terminal T4 is provided in the sensor layer 15 in addition to the first terminal T1 to the third terminal T3. A read-out current is allowed to flow between the third terminal T3 and the fourth terminal T4 in reading-out, and a writing current is allowed to flow between the first terminal T1 and the second terminal T2 in writing. In this configuration, a current path in reading-out, and a current path in writing become independent from each other, and a writing operation and a read-out operation can be executed simultaneously. In addition to this, an error rate requirement for one-bit element can be reduced by designing a circuit in one cell. Note that, with regard to the read-out operation, both the three-terminal structure and the four-terminal structure are common in that the read-out current is allowed to flow in a direction passing through the non-magnetic layer to obtain tunnel resistance. Note that, even in the magnetoresistance effect element 30 illustrated in FIG. 8, the fourth terminal T4 may be provided in the sensor layer 15, or the fourth terminal T4 may be provided in the conductive layer 16 in the magnetoresistance effect element 30.

Figure 10:
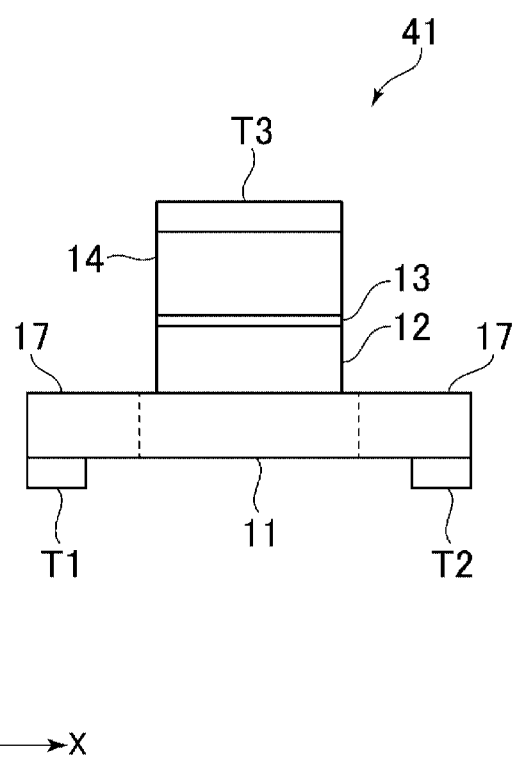
FIG. 10 is a view illustrating a configuration of the magnetoresistance effect element in which both ends of a channel layer are set to a conductive layer.

A magnetoresistance effect element 41 in FIG. 10 has a configuration in which both ends of the channel layer 11 in a longitudinal direction are set to a conductive layer 17 formed from a conductive material. Conductivity of the conductive layer 17 is set to be higher than that of the channel layer 11. According to this configuration, there is an effect that it is easy to flow the writing current.

Figure 11:
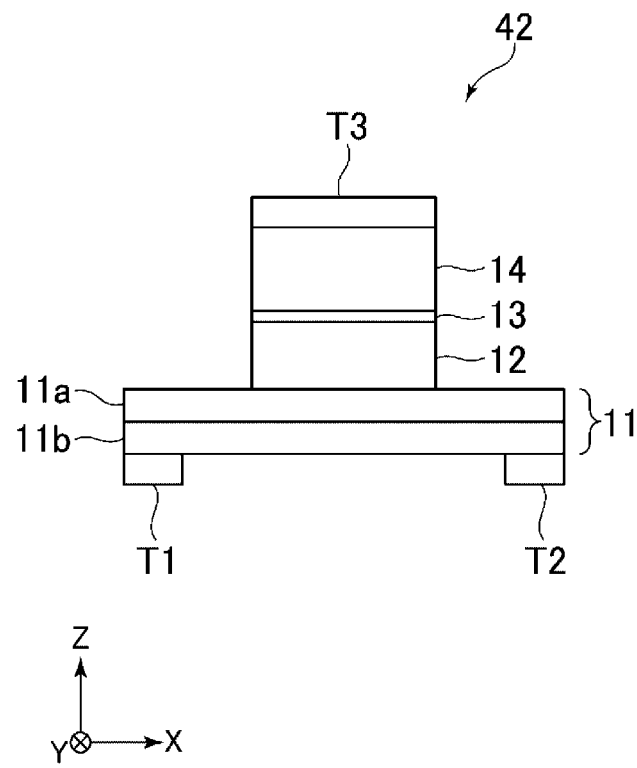
FIG. 11 is a view illustrating a configuration of the magnetoresistance effect element in which the channel layer is set to a two-layer structure.

As illustrated in a magnetoresistance effect element 42 in FIG. 11, the channel layer 11 may be set to a two-layer structure including a first layer 11a containing an antiferromagnetic material and a second layer 11b formed from a high-spin-hall-effect material. Examples of the antiferromagnetic material contained in the first layer 11a include Cr, Mn, Cr—O, Mn—O, Fe—O, Fe—Mn, and the like. In addition, examples of the high-spin-hall-effect material contained in the second layer 11b include Pt, W, Ta, Ir, and the like. In this manner, in a case where the channel layer 11 is set to the two-layer structure, the degree of freedom of design of the channel layer 11 is enhanced, and manufacturing becomes easy. In addition to this, it is possible to make a design so that a magnitude or a pulse width of a current that is used in writing is reduced.

In addition, a seed layer may be provided on a lower surface (surface opposite to the recording layer 12) of the channel layer 11, abase layer may be provided on a lower surface (surface opposite to the channel layer 11) of the seed layer, or a cap layer may be provided on the reference layer 14. Examples of the base layer include films of Ti, V, Cr, Zr, Nb, Mo, Hf, Ta, W, and the like. Examples of the seed layer include films of Cr, Fe, Co, Ni, NiFe, Ru, Rh, Pd, Ag, Cu, Ir, Pt, Au, and the like. Examples of the cap layer include films of Ta, Ru, Cu, Pt, and the like. The base layer, the seed layer, and the cap layer are layers provided to improve adhesion to the substrate, crystal orientation, electrical conductivity, and resistance to corrosion.

Hereinafter, a configuration (film configuration) example of respective layers of the magnetoresistance effect element provided with the base layer, the seed layer, and the cap layer will be described. Note that, in this example, as the reference layer 14, the laminated ferri structure is employed, and as the coupling layer in the laminated ferri structure, Ru is used.

Base layer: Ta in a thickness of 3 nm
Seed layer: Pt in thickness of 4 nm
Channel layer 11: PtMn in a thickness of 7 nm
Recording layer 12: Co in a thickness of 0.3 nm, Ni in a thickness of 0.6 nm, Co in a thickness of 0.3 nm, Ni in a thickness of 0.6 nm, Co in a thickness of 0.3 nm
Non-magnetic layer 13: MgO in a thickness of 1.2 nm
Reference layer 14: CoFeB in a thickness of 1.5 nm, Ta in a thickness of 0.5 nm, Co in a thickness of 0.4 nm, Pt in a thickness of 0.4 nm, Co in a thickness of 0.4 nm, Pt in a thickness of 0.4 nm, Co in a thickness of 0.4 nm, Ru in a thickness of 0.45 nm, Co in a thickness of 0.4 nm, Pt in a thickness of 0.4 nm, Co in a thickness of 0.4 nm, Pt in a thickness of 0.4 nm, Co in a thickness of 0.4 nm, Pt in a thickness of 0.4 nm, Co in a thickness 0.4 nm, Pt in a thickness of 0.4 nm
Cap layer: Ru in a thickness of 5 nm Another example of the configuration (film configuration) of the respective layers of the magnetoresistance effect element is as follows.

Base layer: Ta in a thickness of 3 nm
Channel layer 11: IrMn in a thickness of 3 nm
Recording layer 12: CoFe in a thickness of 1.2 nm
Non-magnetic layer 13: MgO in a thickness of 1.2 nm
Reference layer 14: CoFeB in a thickness of 1.5 nm, Ta in thickness of 0.5 nm, Co in a thickness of 0.4 nm, Pd in a thickness of 0.8 nm, Co in a thickness of 0.4 nm, Pd in a thickness of 0.8 nm, Co in a thickness of 0.4 nm, Pd in a thickness of 0.8 nm, Co in a thickness of 0.4 nm, Pd in a thickness of 0.8 nm, Co in a thickness of 0.4 nm, Pd in a thickness of 0.8 nm
Cap layer: Ru in a thickness of 5 nm Preferred ranges relating to the film thickness or dimensions exemplified are set in view of the current technical level of a semiconductor integrated circuit, and the ranges of the film thickness or the dimensions in which the effect of the invention is obtained can be changed in accordance with the progress of the future processing technology.

Figure 12:
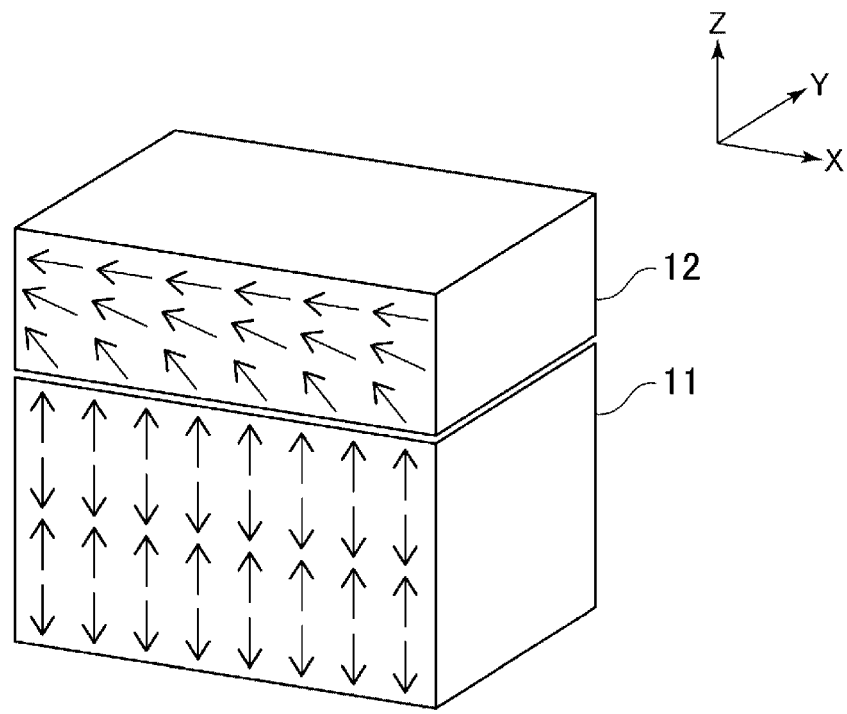
FIG. 12 is a view illustrating an operation of the exchange bias in an example in which the channel layer has a magnetic moment in a vertical direction.

As illustrated in FIG. 12, the channel layer 11 may be provided with magnetic moments in a direction perpendicular to a film surface. In this case, in the magnetic moments inside the channel layer 11, directions thereof are alternate in a direction perpendicular to the film surface. At this time, the recording layer 12 adjacent to the channel layer 11 is set to have an axis of in-plane easy magnetization. A magnetization direction of the recording layer 12 rotates in a vertical direction in the vicinity of an interface with the channel layer 11, and faces the axis of easy magnetization of the recording layer 12 as being spaced apart from the channel layer 11. That is, it can be regarded that a magnetic field in a vertical direction is applied to the recording layer 12.

<Multi-Value Type>

Description has been given of a case where the magnetization state of the recording layer 12 of the magnetoresistance effect element is changed to either the parallel state or the anti-parallel state, the recording layer 12 can be changed to one of the parallel state and the anti-parallel state, or a plurality of magnetization states. That is, the recording layer has a multi-domain structure, magnetization (first magnetization) in the same direction as the magnetization of the reference layer and magnetization (second magnetization) in the opposite direction are mixed in the recording layer, and a ratio of the first magnetization and the second magnetization can be changed. The magnetization state can be determined as resistance when a read-out current is allowed to flow. As a result, a magnetoresistance effect element (hereinafter, referred to as a multi-value type) can be used as an element for storing multi-values (including analog values). In the case of storing multi-values as described above, this can be realized by changing the magnitude of the writing current.

Figure 13:
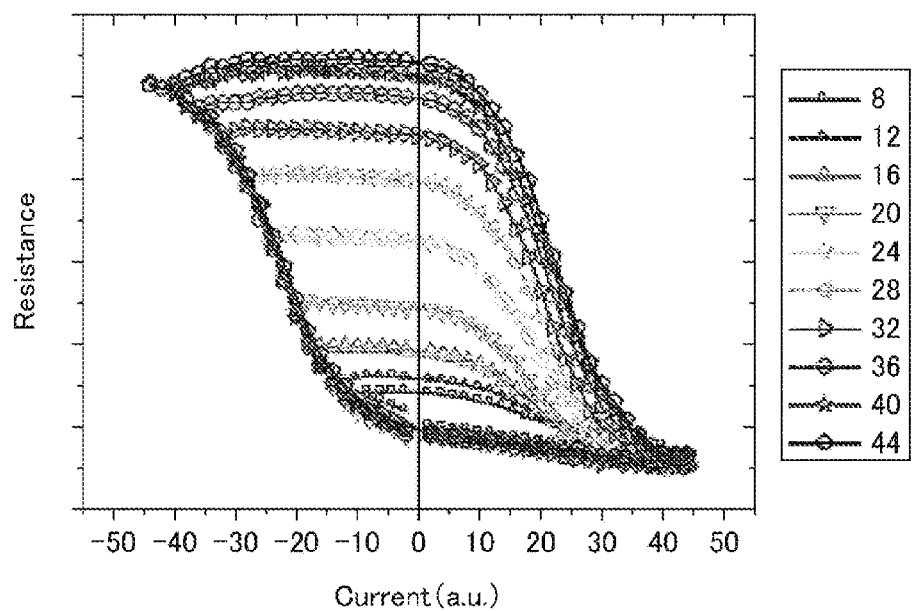
FIG. 13 is a graph showing current-resistance characteristics showing a variation of a resistance value in a case where a current is allowed to flow to the magnetoresistance effect element capable of storing multi-values with −Z direction set as an initial state of a magnetization direction of the recording layer.
Figure 14:
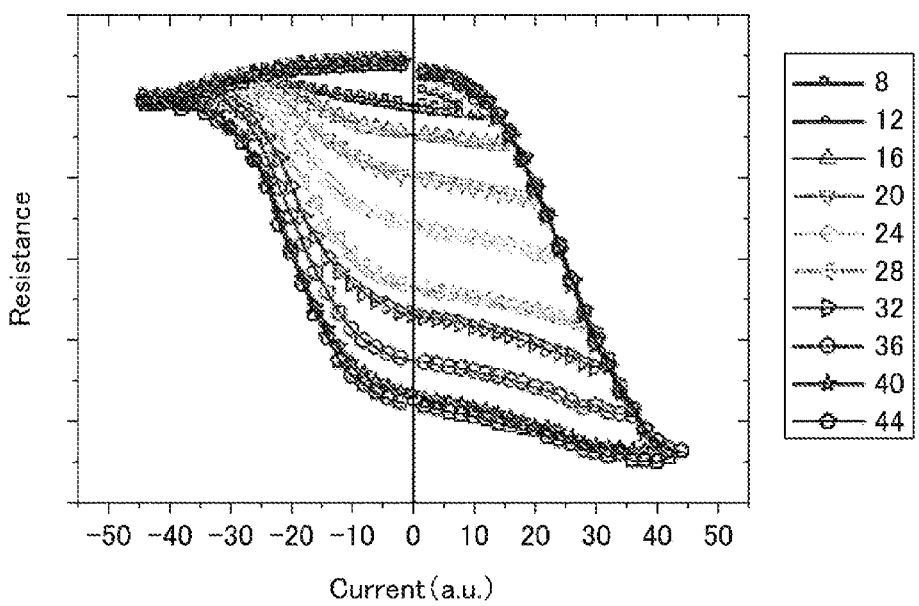
FIG. 14 is a graph showing current-resistance characteristics showing a variation of a resistance value in a case where a current is allowed to flow to the magnetoresistance effect element capable of storing multi-values with +Z direction set as an initial state of a magnetization direction of the recording layer.

FIG. 13 and FIG. 14 show an example of a graph obtained by measuring a variation of a resistance value with respect to a variation of a writing current. A configuration of a magnetoresistance effect element used in the measurement is as follows, and in manufacturing of the magnetoresistance effect element, a heat treatment condition was set to a temperature of 300° C., a holding time was set to two hours, and a magnetic flux density was set to 1.2 T.

Substrate: Ta, 3 nm
Seed layer: Pt, 4 nm
Channel layer: PtMn, 8 nm
Recording layer: [Co/Ni]$_2$(Co, 0.3 nm, Ni, 0.6 nm)
Reference layer: Co, 0.3 nm
Non-magnetic layer: MgO, 2 nm A current is allowed to flow to the magnetoresistance effect element 10 manufactured in this manner, and a variation of a resistance value was measured. As measurement conditions, non-magnetic field, room temperature (20° C.), a current pulse width of one second, and applied current density of $10^{10}$ A/m$^2$ were set.

FIG. 13 illustrates a relationship between resistance and a current in a case where a negative current pulse was allowed to flow in a state in which magnetization of the recording layer 12 faces downward, and then a positive current pulse was allowed to flow. Amplitude of the current pulse was intermittently and gradually increased from 0 up to an arbitrary value, and was gradually decreased up to 0. A measured resistance is a value after application of each pulse current.

FIG. 14 shows a relationship between resistance and a current in a case where a positive current was allowed to flow in a state in which magnetization of the recording layer 12 faces upward, and then a negative current pulse was allowed to flow. Amplitude of the current pulse was intermittently and gradually increased from 0 up to an arbitrary value, and was gradually decreased up to 0. A measured resistance is a value after application of each pulse current.

From the measurement result, it was confirmed that the magnetization direction of the recording layer 12 was reversed without an external magnetic field due to an operation of the exchange bias, and resistance varied in an analog manner with respect to the magnitude of a flowing current. In addition, it was also confirmed that it is possible to make a design so that characteristics suitable for an analog operation are exhibited by changing the film configuration (mainly, the film thickness of the channel layer 11 (PtMn), and the recording layer 12 (Co/Ni)), or characteristics suitable for a digital operation are exhibited.

In the case of using an antiferromagnetic material in the channel layer 11, a binary type operation is realized when the magnitude of the exchange bias is appropriately small. On the other hand, a multi-value type operation is realized when the exchange bias is appropriately large. According to an experiment performed by the present inventors, it could be understood that when an exchange bias magnetic field is 50 mT or greater, the multi-value type operation is easily obtained, and a multi-value state can be stably retained. In addition, it could be understood that when the exchange bias magnetic field is less than 50 mT, the binary type operation is easily obtained.

In order to realize the binary type operation, it is effective to increase squareness of a hysteresis loop. For this reason, it is effective to increase anisotropy in a direction perpendicular to a film surface of the recording layer 12 in addition to reducing the exchange bias magnetic field. For example, it was confirmed that a hysteresis loop with high squareness appropriate for a digital operation is obtained when the film thickness of the Pt seed layer is increased to 5 nm in a case where the film thickness of the channel layer 11 of PtMn is reduced to as thin as 7 nm.

In the magnetoresistance effect element of the multi-value type, it is preferable that the recording layer 12 and the channel layer 11 are set to a polycrystalline structure instead of a single crystalline structure. The reason for this is as follows. In the case of the crystalline structure, a deviation occurs in a direction or the magnitude of the exchange bias in a domain unit, and as a result, an analog behavior is realized. In addition, in order to enhance thermal stability by strengthening the exchange bias, it is also preferable to form a non-magnetic film constituted by a non-magnetic atomic layer between the channel layer 11 and the recording layer 12. In the non-magnetic film, it is also preferable that the atomic layer is formed in a range of one layer to six layers. For example, in a non-magnetic film constituted by a Pt atomic layer, the thickness of the non-magnetic film is in a range of 0.1 to 0.8 nm.

Description has been given of an example in which the channel layer 11 is set as an antiferromagnetic material so as to realize the multi-value type magnetoresistance effect element. However, even though the channel layer 11 is not formed from the antiferromagnetic material, it is possible to realize the multi-value type magnetoresistance effect element. As the channel layer 11, layers formed from a non-magnetic material such as Pt, Ir, Ta, and W can be exemplified. Note that, In order to realize a multi-value type magnetoresistance effect element using the channel layer 11 formed from the non-magnetic materials, it is effective to effectively weaken an exchange interaction between crystal grains of the recording layer 12, and it is effective to increase a domain wall propagation magnetic field in the recording layer 12. In order to weaken the exchange interaction between crystal grains, it is effective to adopt a nano-granular structure or a nano-composite structure. In addition, in order to increase the domain wall propagation magnetic field, it is effective to increase dispersion of anisotropy between crystal grains of the recording layer 12.

Second Embodiment

A second embodiment has the following configuration. Specifically, in a neural network circuit as an example of a circuit device, a multi-value type magnetoresistance effect element is used as a synapse element, and a coupling weight is changed by the magnetoresistance effect element. Note that, in the following description, the same reference numeral will be given to the same constituent member as in the first embodiment, and detailed description thereof will be omitted. In addition, a configuration of the neural network circuit and the like to be described below is illustrative only, and there is no limitation thereto.

Figure 15:
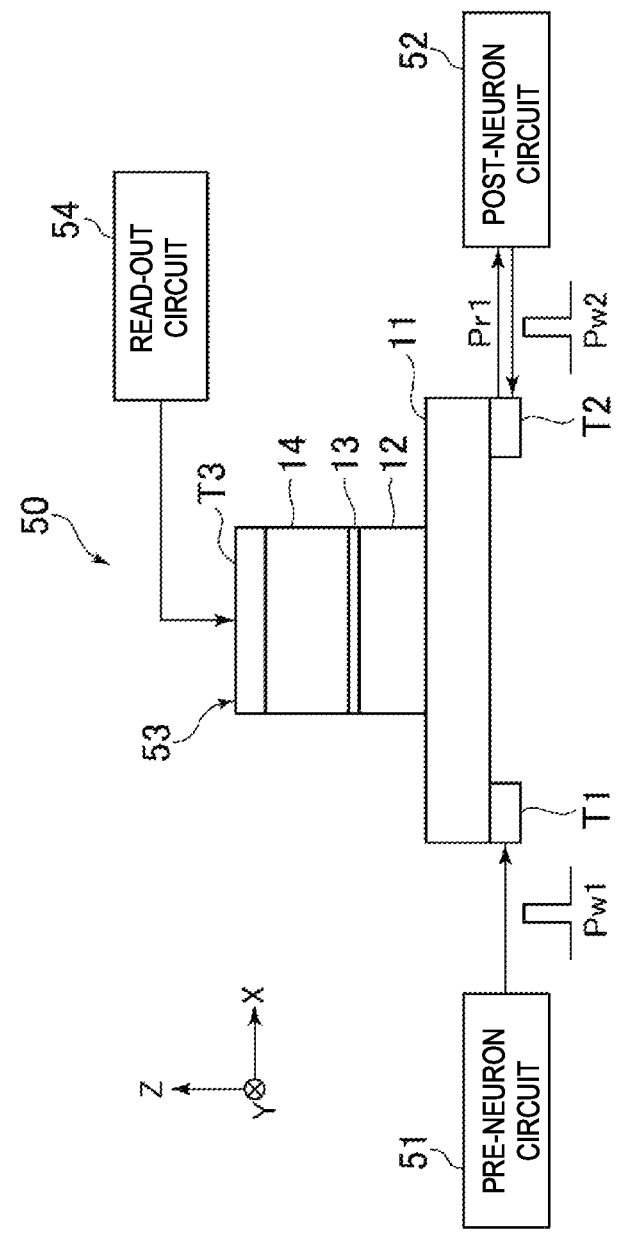
FIG. 15 is a block diagram schematically illustrating a neural network circuit according to a second embodiment.

FIG. 15 illustrates an outline of a neural network circuit 50 according to the second embodiment. The neural network circuit 50 includes a pre-neuron circuit 51, a post-neuron circuit 52, a multi-value type magnetoresistance effect element 53 as a synapse element connected between the pre-neuron circuit 51 and the post-neuron circuit 52, and the like. In FIG. 15, one set of the pre-neuron circuit 51 and the magnetoresistance effect element 53 is drawn, but a plurality of sets of the pre-neuron circuit 51 and the magnetoresistance effect element 53 may be connected to the post-neuron circuit 52.

The neural network circuit 50 realizes spike timing dependent synaptic plasticity (hereinafter, referred to as "STDP") by the magnetoresistance effect element 53. When a focus is given to one synapse, the STDP has a property in which a coupling weight with the synapse located between the pre-neuron and the post-neuron varies in dependence with timing at which a pre-neuron and a post-neuron which are connected before and after the synapse are respectively fired and a spike pulse is output. The STDP includes a symmetric STDP in which the coupling weight varies in dependence with only a pulse time difference of two spike pulses from respective neurons, and an asymmetric STDP in which the coupling weight varies in dependence with the pulse time difference of the two spike pulses and a temporal order. The asymmetric STDP shows a variation in which a variation amount (absolute value) of the coupling weight decreases as the pulse time difference increases. In addition, between a spike pulse from the pre-neuron and a spike pulse from the post-neuron, in a case where the former precedes, the coupling weight increases, and in a case where the latter precedes, the coupling weight decreases.

In the magnetoresistance effect element 53, the pre-neuron circuit 51 is connected to the first terminal T1, and the post-neuron circuit 52 is connected to the second terminal. In addition, a read-out circuit 54 is connected to the third terminal T3. The magnetoresistance effect element 53 stores resistance (hereinafter, referred to as "element resistance") between the reference layer 14 and the recording layer 12 as a coupling weight, and controls a pulse height (the magnitude of a current or a voltage) of a read-out pulse Pr1 (corresponding to the spike pulse) that is input to the post-neuron circuit 52. The read-out circuit 54 applies a predetermined voltage or current to the third terminal T3 to generate the read-out pulse Pr1. According to this, a variation of the element resistance is reflected on the circuit as a variation of the coupling weight.

As the pre-neuron circuit 51 and the post-neuron circuit 52, for example, a circuit based on an integration firing model is used, but there is no limitation to the model. A read-out pulse is input to the pre-neuron circuit 51 from the outside or through a magnetoresistance effect element from another neuron circuit. The read-out pulse may be amplified by using an amplifier or the like. The post-neuron circuit 51 is constituted by an integration circuit that integrates a current or a voltage that is input as a read-out pulse, a circuit that outputs the following writing current pulse Pw1 when an integrated value of the integration circuit reaches a predetermined threshold (or in synchronization therewith), or the like. This configuration is also true of the post-neuron circuit 52, and the following writing current pulse Pw2 is output.

The writing current pulse Pw1 from the pre-neuron circuit 51 is input to the first terminal T1 of the magnetoresistance effect element 53, and the writing current pulse Pw2 from the post-neuron circuit 52 is input to the second terminal T2. According to this, in the channel layer 11, when the pre-neuron circuit 51 is fired, a writing current in accordance with input of the writing current pulse Pw1 flows in the +X-axis direction, and when the post-neuron circuit 52 is fired, a writing current in accordance with input of the writing current pulse Pw2 flows in the −X-axis direction.

As described above, when the writing current pulses Pw1 and Pw2 are input to the magnetoresistance effect element 53, a pulse time difference of the writing current pulses Pw1 and Pw2 changes an element resistance, that is, a coupling weight of the synapse in accordance with a temporal order. A decrease in the element resistance corresponds to an increase in the coupling weight of the synapse, and an increase in the element resistance corresponds to a decrease in the coupling weight of the synapse.

The input order of the writing current pulses Pw1 and Pw2 to the first terminal T1 and the second terminal T2, and the variation of the coupling weight at that time are determined by a magnetization direction of the reference layer 14, or the like. As to be described later in detail, in a case where the writing current pulses Pw1 and Pw2 are input within predetermined time, a variation direction (increase or decrease) of the element resistance is determined by a direction of a writing current that flows due to a second (subsequent) writing current pulse subsequent to a first (preceding) writing current pulse. In order to accomplish the above-described asymmetric STDP, when the writing current pulse Pw2 is input as a second writing current pulse, the writing current may flow to the channel layer 11 in a direction of decreasing the element resistance, that is, in a direction in which magnetization in the same direction as that of magnetization of the reference layer 14 increases in the recording layer 12. Note that, in an actual neural network circuit, both the pre-neuron circuit and the post-neuron circuit may be designed to be locally and automatically fired without being controlled from the outside. In this case, only in a case where firing timings of the pre-neuron circuit and the post-neuron circuit are close to each other, the coupling weight of the synapse varies in accordance with the order, and in a case where firing occurs at timings distant from each other, the coupling weight does not vary.

Figure 16:
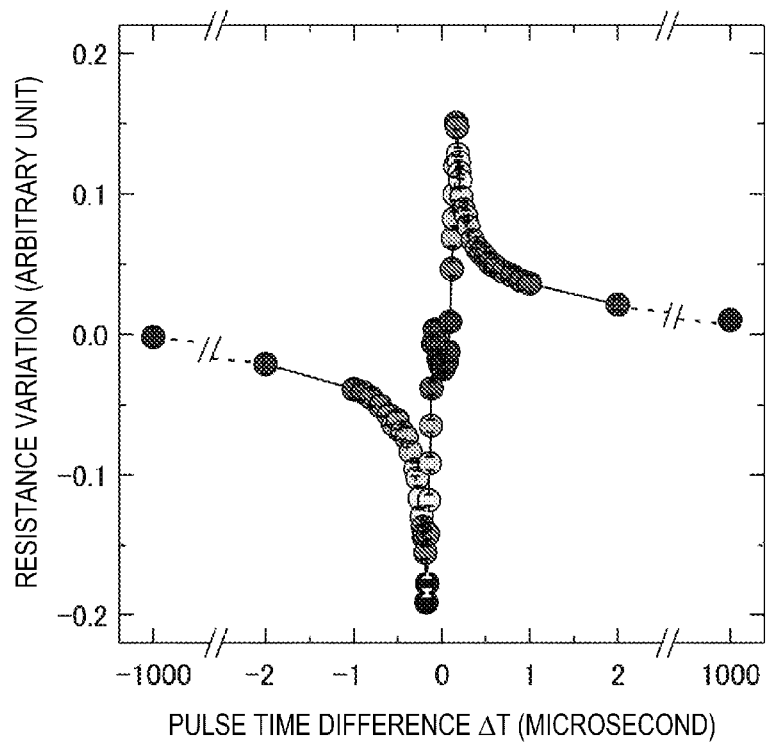
FIG. 16 is a graph obtained by measuring a relationship between a pulse time difference and a resistance variation of the magnetoresistance effect element when current pulses different in direction are input.
Figure 17:
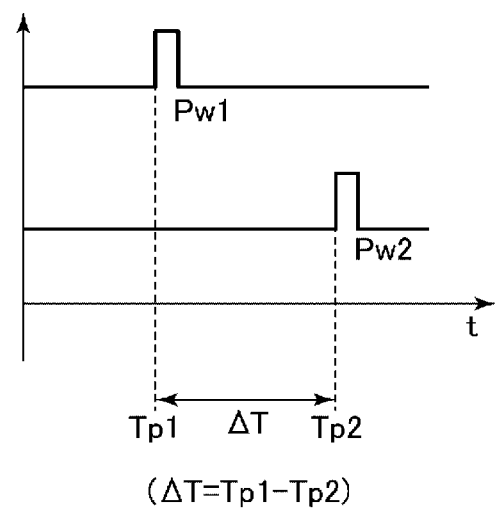
FIG. 17 is a view illustrating the pulse time difference.

FIG. 16 illustrates an actual variation of the element resistance of the magnetoresistance effect element 53 with respect to a variation of a pulse time difference $\Delta T$ of the writing current pulses Pw1 and Pw2. Note that, as illustrated in FIG. 17, the pulse time difference $\Delta T$ is a difference between input timings Tp1 and Tp2 of the writing current pulses Pw1 and Pw2, and with regard to "positive and negative" thereof, a case where the writing current pulse Pw1 precedes is set as "negative" and a case where the writing current pulse Pw2 precedes is set as "positive" ($\Delta T=Tp1-Tp2$). In addition, a pulse width of the writing current pulses Pw1 and Pw2 is set to 175 ns, and a waveform is set to a rectangular wave.

The element resistance shows the following variation. Specifically, the further the pulse time difference $\Delta T$ between the writing current pulses Pw1 and Pw2 is closer to "0", the greater the variation amount (absolute value) is, and the variation amount (absolute value) decreases as the pulse time difference $\Delta T$ increases. In addition, it can be understood that a variation direction (increase or decrease) is determined depending on the temporal order of the writing current pulses Pw1 and Pw2. That is, it can be understood that the magnetoresistance effect element 53 can be used as a synapse element having characteristics of the asymmetric STDP.

In the magnetoresistance effect element 53 used here, the channel layer 11 generates heat with the writing current in accordance with the preceding writing current pulse, and a temperature of the recording layer 12 rises. In the recording layer 12, the magnetization direction is likely to vary due to the temperature rising, and a direction of partial magnetizations of the recording layer 12 is reversed with the writing current in accordance with the subsequent writing current pulse, and the magnetization state is changed. The temperature of the recording layer 12 of which a temperature rises decreases due to heat conduction to peripheral members with the passage of time, and the recording layer 12 returns to a static state in which the temperature does not rise. In the course of returning to the static state, even when the writing current pulse is input, it enters a state in which the magnetization state of the recording layer 12 is not changed. According to this, in a case where the subsequent writing pulse is input within predetermined time from the preceding writing current pulse, change of the magnetization state of the recording layer 12 occurs, and when the writing current pulse is input after passage of predetermined time, the change of the magnetization state of the recording layer 12 does not occur. In addition, in the recording layer 12, as the temperature is higher, the degree of easiness of change of the magnetization direction increases. According to this, the magnetoresistance effect element 53 shows the same variation in the element resistance as in characteristics of the asymmetric STDP with respect to the pulse time difference ΔT of the writing current pulses Pw1 and Pw2.

In the writing current pulses Pw1 and Pw2, a pulse height (magnitude of the writing current) and a pulse width are set to a magnitude that substantially does not change the magnetization state of the recording layer 12 in a static state in which a temperature does not rise with the writing current.

Since the characteristics of the asymmetric STDP are realized by using characteristics of the magnetoresistance effect element 53, a circuit that generates a specific waveform for realizing the characteristics of the asymmetric STDP, and the like are not necessary. Accordingly, this is advantageous for a reduction in area of a circuit, and power saving. In addition, since the data rewriting operation in the magnetoresistance effect element 53, that is, a coupling weight updating operation in this example can be performed at a high speed, this is advantageous for realizing an improvement of a processing speed in the neural network circuit 50.

It is preferable that resistivity of the channel layer 11 is set within a range of 10 to 1000 μΩ·cm. When the resistivity is 10 μΩ·cm or greater, heat generation necessary for obtaining the characteristics of the asymmetric STDP is reliably obtained, and when the resistivity is 1000 μΩ·cm or less, driving is possible at a power supply voltage that is typically used in the neural network circuit 50 or the like. Note that, in a case where the channel layer 11 has a laminated structure including a plurality of layers, resistivity of a layer having the greatest volume may be set to satisfy the above-described conditions.

An aspect of the temperature variation of the recording layer 12 can also be controlled by appropriately selecting thermal conductivity of a material that covers a surface of the magnetoresistance effect element 53. It is preferable that the thermal conductivity is within a range of 0.5 to 180 W/(m·K). When the thermal conductivity is 0.5 W/(m·K) or greater, it is possible to suppress rapid temperature rising in the recording layer 12 and it is possible to secure a sufficient circuit margin. When the thermal conductivity is 180 W/(m·K) or less, it is possible to reliably suppress the recording layer 12 from returning to the static state within extremely short time, and thus the characteristics of the asymmetric STDP are reliably obtained. Examples of the material include Si—O, Si—N, Al—O, Al—N, Zr—O, Ti—O, and the like.

It is preferable that the pulse width of the writing current pulses Pw1 and Pw2 is within a range of 10 ns to 10 μs. When the pulse width of the writing current pulses Pw1 and Pw2 is 10 ns or greater, heat generation necessary for the channel layer 11 can be reliably obtained, and when the pulse width is 10 μs or less, the channel layer 11 can reliably prevent heat generation from being saturated. In addition, the pulse width is more preferably 30 ns to 1 μs. When the pulse width is 30 ns or greater, more sufficient heat generation is obtained, and when the pulse width is set to 1 μs or less, power consumption can be suppressed to be small. In this range, circuit design is also easy. A waveform of the pulse may be a triangular wave or trapezoidal wave other than the rectangular wave.

In the recording layer 12, the pulse time difference ΔT that is effective for occurrence of the same change of the magnetization state as in the characteristics of the asymmetric STDP depends on a temperature rising speed and a temperature lowering speed due to heat dissipation in the recording layer 12, and for example, the pulse time difference ΔT is 10 ns to 10 μs. A ratio of the effective pulse time difference ΔT to the pulse width is preferably 0.1 to 50. When the ratio is 0.1 or greater, it does not enter a state in which the writing current pulses Pw1 and Pw2 are approximately simultaneously input, and a resistance value of the magnetoresistance effect element 53 reliably varies. In addition, when the ratio is 50 or less, the two writing current pulses Pw1 and Pw2 with symbols different from each other do not arrive independently, and thus effects of the writing current pulses Pw1 and Pw2 on the magnetoresistance effect element 53 do not cancel each other, and as a result, effective change of the magnetization state is reliably obtained.

Figure 18:
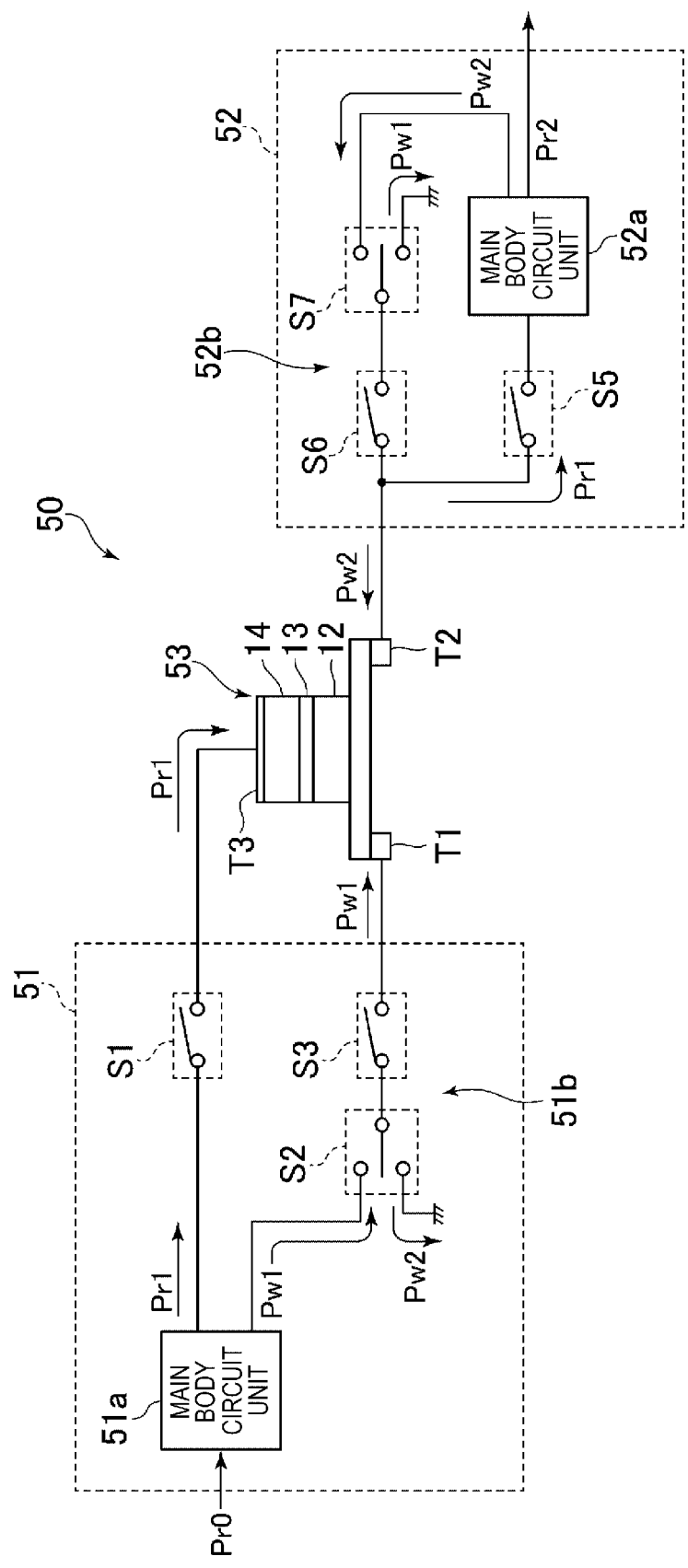
FIG. 18 is a view illustrating a configuration example of a neural network circuit.

FIG. 18 is an example in which the neural network circuit 50 is illustrated in more detail. The pre-neuron circuit 51 includes a main body circuit unit 51a including the read-out circuit 54, and a first interface circuit 51b, and the main body circuit unit 51a is connected to the magnetoresistance effect element 53 through the first interface circuit 51b. The post-neuron circuit 52 includes a main body circuit unit 52a and a second interface circuit 52b, and is connected to the magnetoresistance effect element 53 through the second interface circuit 52b. Note that, the pre-neuron circuit 51 includes a second interface circuit, and the post-neuron circuit 52 includes a first interface circuit, but the configurations are omitted in FIG. 18.

The main body circuit unit 51a outputs the read-out pulse Pr1 and the writing current pulse Pw1. Note that, the read-out pulse Pr1 is generated when applying a voltage or a current to the third terminal T3. The main body circuit unit 52a of the post-neuron circuit 52 integrates a current or a voltage of the read-out pulse Pr1, and outputs a read-out pulse Pr2 and a writing current pulse Pw2 on the basis of the integration result.

In FIG. 18, although being drawn as a switch that switches a route of a pulse signal, actually, the first interface circuit 51b and the second interface circuit 52b are actually constituted by a transistor or the like that applies a voltage or a current to the first terminal T1 to the third terminal T3 of the magnetoresistance effect element 53 so that respective pulse signals of the read-out pulse Pr1, and the writing current pulses Pw1 and Pw2 flow, or performs control so that the pulse signals flow along a predetermined route.

In a case where the main body circuit unit 51a of the pre-neuron circuit 51 applies a voltage to the third terminal T3 and outputs the read-out pulse Pr1, switches S1 and S5 are turned on, switches S3 and S6 are turned off, the read-out pulse Pr1 is input to the main body circuit unit 52a from the third terminal T3 through the reference layer 14, the non-magnetic layer 13, the recording layer 12, the channel layer 11, and the second terminal T2. The main body circuit unit 52a integrates a current or a voltage of the read-out pulse Pr1 that is input, but the magnitude of the current or the voltage (pulse height of the read-out pulse Pr1) becomes a magnitude depending on element resistance based on a magnetization state of the recording layer 12.

The writing current pulse Pw1 is output from the main body circuit unit 51a with a delay by delay time ΔTd from a point of time at which the read-out pulse Pr1 is output. At this time, the switches S3 and S6 are turned on, the switches S1 and S5 are turned off, a switch S2 is switched to the main body circuit unit 51a side, and a switch S7 is switched to a ground side. According to this, the writing current pulse Pw1 is input to the first terminal T1, and a current thereof flows through the channel layer 11 toward the second terminal T2.

In a case where the main body circuit unit 52a outputs the read-out pulse Pr2, the writing current pulse Pw2 is output with a delay by delay time ΔTd from the output time. At this time, the switches S3 and S6 are turned on, the switches S1 and S5 are turned off, the switch S7 is switched to the main body circuit unit 52a side, and the switch S2 is switched to the ground side. According to this, the writing current pulse Pw2 is input to the second terminal T2, and a current thereof flows through the channel layer 11 toward the first terminal T1.

As described above, in this example, since the writing current pulses Pw1 and Pw2 are output with a delay by the constant delay time ΔTd in comparison to the read-out pulses Pr1 and Pr2, the writing current pulses Pw1 and Pw2 are input to the first terminal T1 and the second terminal T2, respectively, with an interval of firing timing of each of the pre-neuron circuit 51 and the post-neuron circuit 52. An interval between the writing current pulses Pw1 and Pw2 may be proportional to an interval of the firing timing.

The output timings of the writing current pulses Pw1 and Pw2 may be the same as each other. At this time, the switches S2 and S7 are switched to the main body circuit units 51a and 52a side, respectively. Accordingly, the same voltage is applied to the first terminal T1 and the second terminal T2, and a current does not flow to the channel layer 11.

Figure 19:
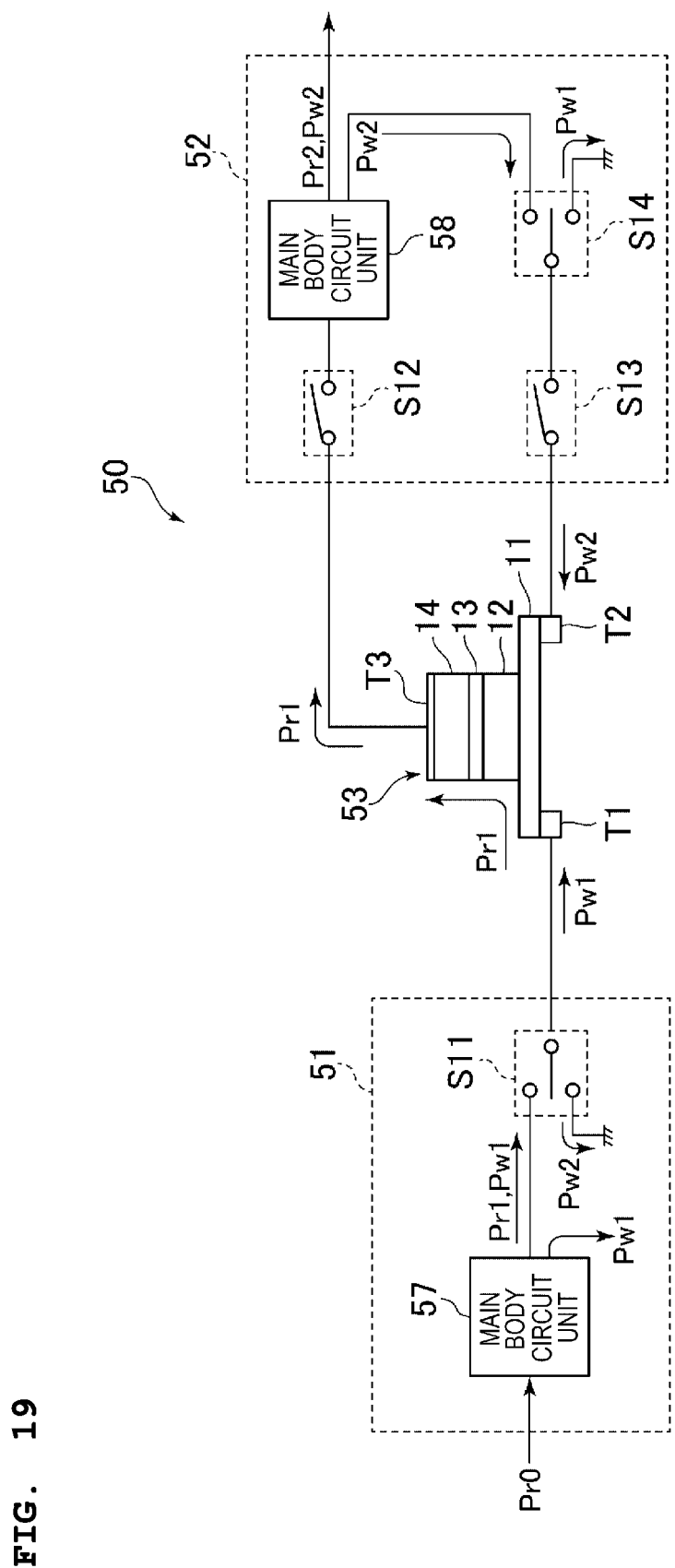
FIG. 19 is a view illustrating another configuration example of the neural network circuit.

FIG. 19 illustrates another example in which the neural network circuit 50 is illustrated in more detail. This example has a configuration in which the read-out pulse Pr1 and the writing current pulse Pw1 from the pre-neuron circuit 51 are input to the first terminal T1. Main body circuit units 57 and 58 are similar to the main body circuit units 51a and 52a except that an output terminal common to the read-out pulse Pr1 and the writing current pulse Pw1 is provided.

In this example, in the case of outputting the read-out pulse Pr1, a switch S11 in the pre-neuron circuit 51 is switched to the main body circuit unit 57 side, and a switch S12 in the post-neuron circuit 52 is turned on, and a switch S13 in the post-neuron circuit 52 is turned off. According to this, the read-out pulse Pr1 is input to the first terminal T1, and is input to the main body circuit unit 58 through the channel layer 11, the recording layer 12, the non-magnetic layer 13, the reference layer 14, and the third terminal T3. As a result, the read-out pulse Pr1 having a pulse height depending on element resistance based on a magnetization state of the recording layer 12 is input to the main body circuit unit 58.

When the writing current pulse Pw1 is output from the main body circuit unit 57, the switch S11 is switched to the main body circuit unit 57 side, the switch S12 in the post-neuron circuit 52 is turned off, the switch S13 in the post-neuron circuit 52 is turned on, and a switch S14 in the post-neuron circuit 52 is switched to the ground side. According to this, the writing current pulse Pw1 is input to the first terminal T1, and a current thereof flows through the channel layer 11 toward the second terminal T2.

When the writing current pulse Pw2 is output from the main body circuit unit 58, the switch S12 is turned off, the switch S13 is turned on, the switch S14 is switched to the main body circuit unit 58 side, and the switch S11 is switched to the ground side. According to this, the writing current pulse Pw2 is input to the second terminal T2, and a current thereof flows through the channel layer 11 toward the first terminal T1.

In the above description, the property in which the magnetization of the recording layer 12 is likely to be reversed by temperature rising of the recording layer 12 is used. That is, the static state of the recording layer 12 of which a temperature does not rise with a writing current is set to the most stable state, the recording layer 12 is energetically excited from the most stable state by raising the temperature with a preceding writing current, and the magnetization state of the recording layer 12 is changed by the subsequent writing current pulse. As an energetic excitation method other than the temperature rising, for example, magnetization dynamics can be used. In the case of controlling magnetization with a plurality of writing current pulses by using the magnetization dynamics, design may be made so that when magnetization moves dynamically on the basis of a Landau-Lifshitz-Gilbert equation, the magnetization moves with a previously input writing current pulse away from an equilibrium state, and the magnetization reversal is induced by a subsequently input writing current pulse. In this case, as a pulse width of the writing current pulse, a range of 10 ps to 5 ns is preferable, and an interval between two writing current pulses effective for occurrence of change of the magnetization state is 20 ps to 2 ns. As described above, with regard to the change of the magnetization state of the recording layer 12 in this example, in broader meaning, the recording layer 12 is energetically excited from the most stable state with the preceding writing current pulse, and the magnetization state of the recording layer 12 is changed with the subsequent writing current pulse.

Third Embodiment

In a third embodiment, a magnetoresistance effect element is used as an element (hereinafter, referred to as "integration element") that performs an integration operation in a neuron circuit as an example of a circuit unit by using a property in which when n current pulses depending on a pulse frequency (pulse interval) are input, a magnetization direction can be reversed with an $n^{th}$ current pulse or a property in which the magnetization direction can be reversed with the $n^{th}$ current pulse in correspondence with the number of pulses when a pulse frequency is fixed, and a property in which when a plurality of pulses are input from a plurality of channels, the magnetization direction can be reversed only when the input timing is close. A program method using the first property is referred to as rate coding, and a program method using the final property is referred to as timing coding. Note that, in configurations other than the following configuration, the same reference numeral will be given to the same constituent member as in the first embodiment, and detailed description thereof will be omitted. In addition, a configuration of a neuron circuit and the like to be described below is illustrative only, and there is no limitation to the configuration and the like.

Figure 20:
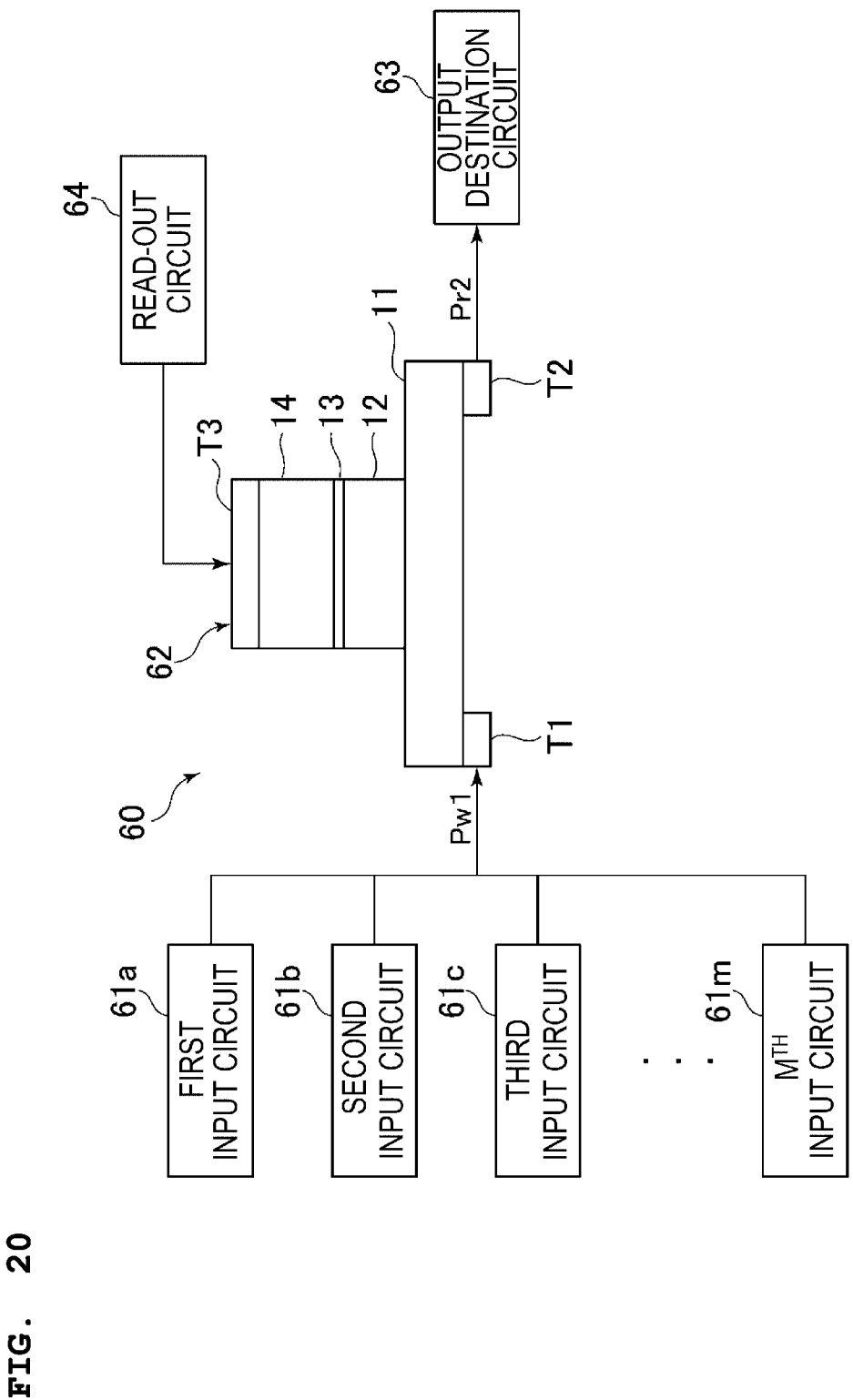
FIG. 20 is a block diagram schematically illustrating a circuit according to a third embodiment.

As illustrated in FIG. 20, first to $M^{th}$ (M is two or greater) input circuits 61a to 61 m (hereinafter, referred to as "input circuit 61" in a case where the circuits are not particularly distinguished) are connected to a first terminal T1 of a magnetoresistance effect element 62 provided in a neuron circuit 60. For example, the input circuit 61 is a pre-neuron circuit, and outputs a writing current pulse Pw1 corresponding to a spike pulse at arbitrary timing. A current due to the writing current pulse Pw1 flows through the inside of a channel layer 11 from the first terminal T1 toward a second terminal T2.

The neuron circuit 60 is provided with an output destination circuit 63 and a read-out circuit 64. The read-out circuit 64 applies a predetermined voltage or current to a third terminal T3, and outputs a read-out pulse Pr2 having a pulse height (magnitude of the current or voltage) depending on element resistance of the magnetoresistance effect element 62 from the second terminal T2 to the output destination circuit 63. The magnetoresistance effect element 62 is provided as an integration element for realizing an integration function in an integration firing model. The output destination circuit 63 is a pulse generation circuit that generates a pulse, for example, when an integration value exceeds a threshold, or the like. Note that, in the magnetoresistance effect element 62, firing characteristics vary in dependence on a typical frequency of the writing current pulse Pw1 that is input. More specifically, in a case where the writing current pulse Pw1 that is input is frequently applied (the typical frequency is high), or in a case where the number of the writing current pulses Pw1 which are input within predetermined time is great, firing occurs, but in a case where frequency of the writing current pulse Pw1 that is input is low (typical frequency is low) or in a case where the number of the writing current pulses Pw1 which are input within predetermined time is small, firing does not occur. These characteristics are referred to as Leaky Integrate and Fire in a neural network.

Figure 21:
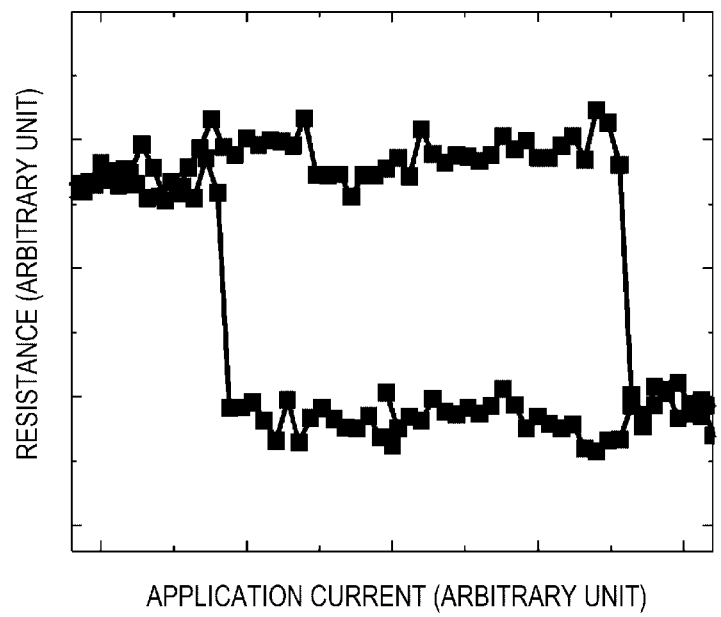
FIG. 21 is a graph obtained by measuring a relationship between a writing current of a magnetoresistance effect element used in the third embodiment and resistance of the magnetoresistance effect element.

The magnetoresistance effect element 62 is a binary type in which with regard to an actual variation of element resistance with respect to a current that flows to the channel layer 11, a magnetization state of a recording layer 12 is changed to one of a parallel state and an anti-parallel state as illustrated in FIG. 21. For example, in a case where the magnetization state is changed by the writing current pulse Pw1, the magnetoresistance effect element 62 is changed from the anti-parallel state to the parallel state.

For example, a pulse height and a pulse width of respective writing current pulses Pw1 are determined in correspondence with characteristics of the channel layer 11 and the recording layer 12, and the like so that when $n_q$ ($n_q$ is an integral of two or greater) writing current pulses Pw1 are input to the magnetoresistance effect element 62 at a specific pulse frequency, a temperature of the recording layer 12 rises to a temperature (hereinafter, referred to as a threshold temperature) capable of changing the magnetization state of the recording layer 12 in accordance with one writing current pulse Pw1 by first to $(n_q-1)^{th}$ writing current pulses Pw1, and the magnetization state of the recording layer 12 is changed from the anti-parallel state to the parallel state in response to input of the $n_q^{th}$ writing current pulse Pw1. Note that, in the case of reversing the magnetization state of the recording layer 12 by the $n_q^{th}$ writing current pulse Pw1, it is necessary for the recording layer 12 to be a temperature equal to or higher than the threshold temperature at a point of time at which the $n_q^{th}$ writing current pulse Pw1 is input.

In addition, since the magnetization state of the recording layer 12 is reversed by the $n_q^{th}$ writing current pulse Pw1, individual writing current pulses Pw1 have a magnitude that does not change the magnetization state of the recording layer 12 that is in a static state without temperature rising with the writing current.

As described above, when the writing current pulse Pw1 is input to the magnetoresistance effect element 62 at a specific pulse frequency, or at a specific pulse frequency or higher within predetermined time, the magnetization state of the recording layer 12 can be reversed by input of n writing current pulses Pw1 depending on the pulse frequency. The number n of the writing current pulses Pw1 necessary to reverse the magnetization state of the recording layer 12 also decreases as the pulse frequency is higher. In this case, the temperature of the recording layer 12 is raised to be equal to or higher than the threshold temperature by the first to $(n-1)^{th}$ writing current pulses Pw1, and the magnetization state of the recording layer 12 is changed from the anti-parallel state to the parallel state in response to input of the $n^{th}$ writing current pulse Pw1.

Figure 22:
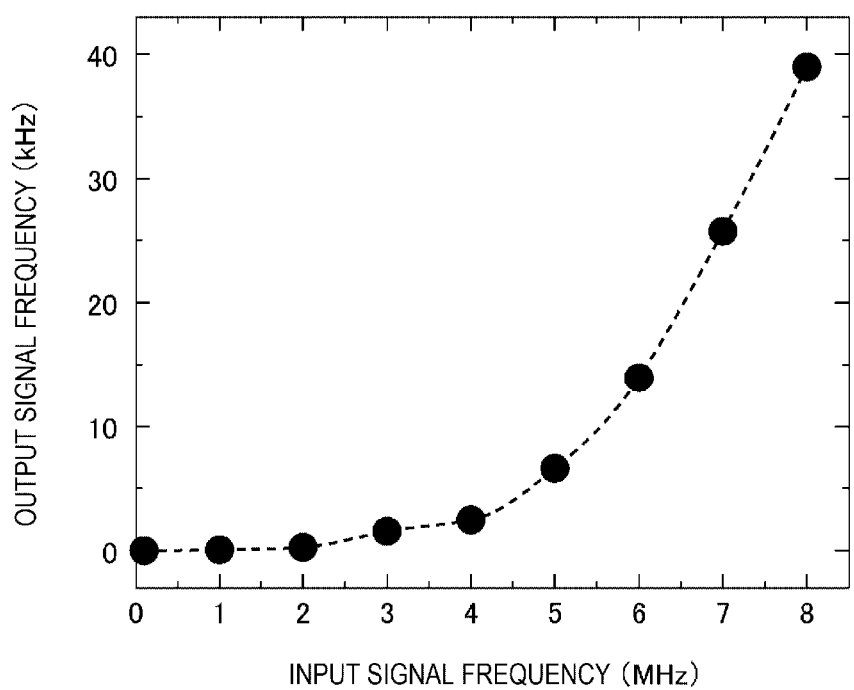
FIG. 22 is a graph obtained by measuring a relationship between an input frequency of a writing current pulse and an output signal frequency indicating magnetization reversal frequency of the recording layer.
Figure 23:
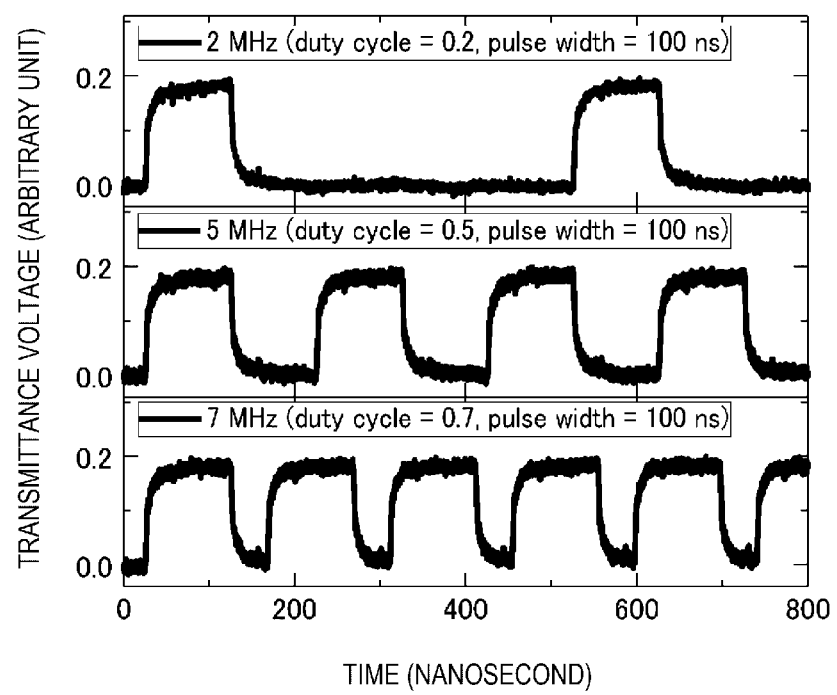
FIG. 23 is a waveform diagram illustrating an input waveform of the writing current pulse.

FIG. 22 illustrates results obtained by measuring a relationship between a pulse frequency (input signal frequency) of the writing current pulse and an output signal frequency indicating reversal frequency of the magnetization direction of the recording layer 12. Note that, in the measurement, the magnetization direction of the recording layer 12 is returned to the original state whenever the magnetization direction is reversed. Waveforms of writing current pulses of which pulse frequencies are 2 MHz, 5 MHz, and 7 MHz when performing the measurement are illustrated in FIG. 23. From the measurement, it can be understood that in a case where the pulse frequencies are lower than a predetermined frequency, magnetization of the recording layer 12 is not reversed, and in a case where the pulse frequencies are set to be equal to or higher than the predetermined frequency, reversal of the magnetization occurs, and reversal frequency is higher as the pulse frequencies are higher. That is, an influence of input of the writing current pulse Pw1 to the magnetoresistance effect element 62 is attenuated with the passage of time. However, the influence is accumulated because an influence of input of the writing current pulse Pw1 is greater than the degree of attenuation of the influence, and the magnetization direction of the recording layer 12 is reversed by input of the writing current pulse Pw1 in a state in which the influence reaches to a constant level. In addition, the influence of input of the writing current pulse Pw1 can be considered as a temperature of the recording layer 12.

Accordingly, according to the configuration, it is possible to detect whether or not n writing current pulses Pw1 in which a pulse frequency satisfies a predetermined condition are input as a variation of element resistance of the magnetoresistance effect element 62, that is, as a variation of a pulse height of the read-out pulse Pr2.

Even when the pulse frequency is not constant, it is possible to raise the temperature of the recording layer 12 to the threshold temperature. Accordingly, it is not necessary for the pulse frequency of the writing current pulse Pw1 input to reverse the magnetization state of the recording layer 12 to be constant. According to this, the magnetoresistance effect element 62 can be used as an integration element of a post-neuron circuit connected to each pre-neuron circuit in which output timing of a signal corresponding to a spike pulse is not determined. In this case, whether or not the magnetization state of the recording layer 12 is reversed is determined depending on a pulse width, a pulse height, and a pulse input interval of a plurality of writing current pulse Pw1 corresponding to the spike pulse. In addition, the waveform of the input pulse is also arbitrary, and a rectangular wave, a triangular wave, a trapezoidal wave, or the like is used.

A preferred range of resistivity of the channel layer 11 is similar to a preferred range of thermal conductivity of a material that covers a surface of the magnetoresistance effect element 62, and a preferred range of the pulse width of the writing current pulse Pw1 is similar to the range illustrated with respect to the magnetoresistance effect element of the second embodiment. Note that, when the resistivity of the channel layer 11 is equal to or greater than a lower limit value of the preferred range, heat generation necessary for realizing an integration function in the integration firing model is reliably obtained. In addition, when the thermal conductivity of the material that covers the surface of the magnetoresistance effect element 62 is equal to or less than the upper limit of the preferred range, it is possible to reliably suppress the recording layer 12 from returning to the static state within extremely short time, and thus the integration function can be used.

As described above, when the magnetoresistance effect element 62 is used as the integration element in the neuron circuit, the integration function is realized with only the magnetoresistance effect element 62, and thus this is advantageous for a reduction in area and power saving. In addition, since the data rewriting operation in the magnetoresistance effect element 62, that is, in this example, the integration operation can be performed at a high speed, this is advantageous for realizing a high speed of the neuron circuit, and the neural network circuit.

Figure 24:
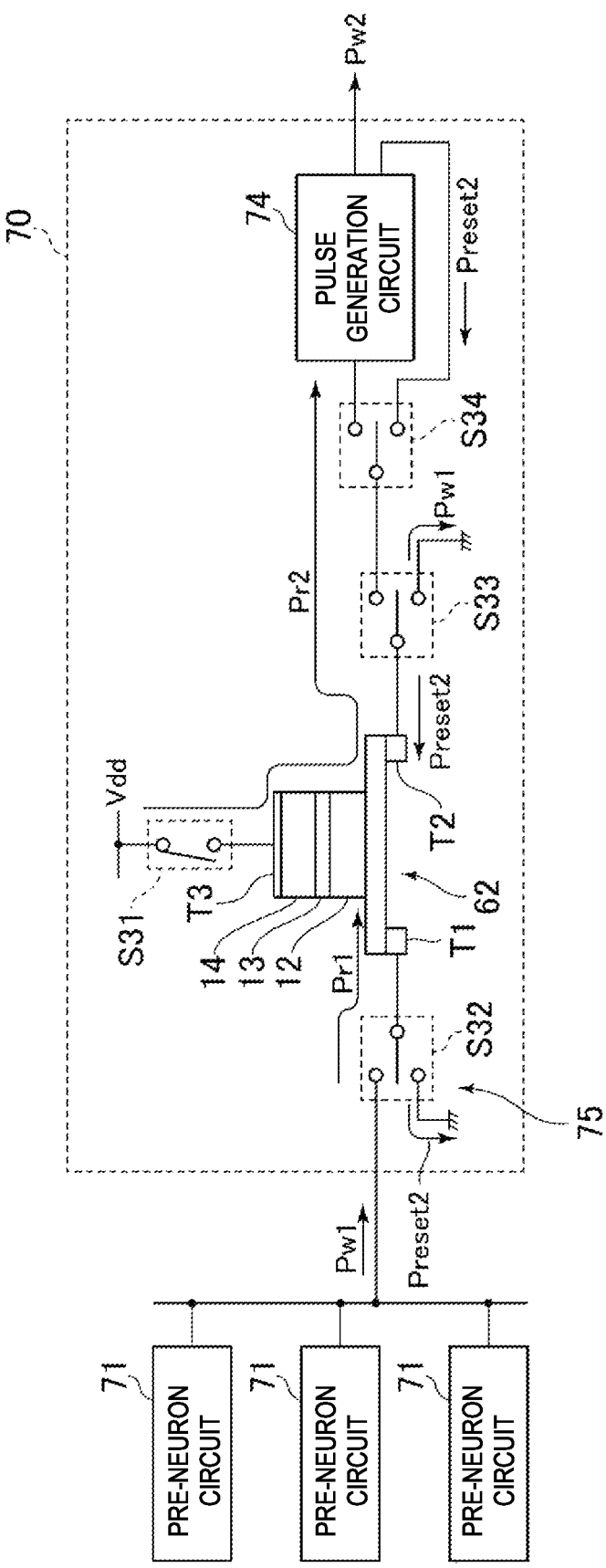
FIG. 24 is a view illustrating a configuration example in which the magnetoresistance effect element is used as an integration element in a neuron circuit.

FIG. 24 illustrates one of more specific examples of the neuron circuit 60 that uses the magnetoresistance effect element 62. A post-neuron circuit 70 corresponding to the neuron circuit 60 is connected to a plurality of pre-neuron circuits 71. Each of the pre-neuron circuits 71 outputs a writing current pulse Pw1 corresponding to a spike pulse at an arbitrary timing, and inputs the writing current pulse Pw1 to the post-neuron circuit 70.

The post-neuron circuit 70 includes the magnetoresistance effect element 62, a pulse generation circuit 74, and an interface circuit 75. The interface circuit 75 is drawn as various switches which switch a route of a pulse signal, but is actually constituted by a transistor or the like that applies a voltage or a current to the first terminal T1 to the third terminal T3 of the magnetoresistance effect element 62 so that respective currents of the read-out pulse Pr2 and the writing current pulse Pw1 flow, or performs control so that the pulse signal flows along a predetermined route.

When the writing current pulse Pw1 is input to the post-neuron circuit 70, a switch S31 is turned off, a switch S32 is switched to the pre-neuron circuit 71 side, and a switch S33 is switched to a ground side. According to this, the writing current pulse Pw1 is input to the first terminal T1, and a current thereof flows through the channel layer 11 toward the second terminal T2. When the writing current pulse Pw1 flows through the channel layer 11, in a case where a temperature of the recording layer 12 is not equal to or greater than the threshold temperature, the magnetization state of the recording layer 12 is not changed. In addition, when the writing current pulse Pw1 flows through the channel layer 11, the channel layer 11 generates heat, and in response to this, the temperature of the recording layer 12 rises. After the temperature rises, the temperature of the recording layer 12 lowers due to heat dissipation.

When a pulse interval of the writing current pulse Pw1 input to the post-neuron circuit 70 is shortened, the temperature of the recording layer 12 rises. In addition, in a state in which the temperature of the recording layer 12 reaches the threshold temperature due to subsequently input writing current pulses Pw1, when the subsequent writing current pulse Pw1 is input, magnetization of the recording layer 12 is reversed from the anti-parallel state to the parallel state.

In a case where a voltage or a current is applied to the third terminal T3, and the read-out pulse Pr2 is output, the switch S31 as the read-out circuit 64 is turned on, the switch S32 is in a neutral position that is not connected to any side, the switch S33 is switched to a switch S34 side, and the switch S34 is switched to an input side of the pulse generation circuit 74. According to this, the read-out pulse Pr2 is transmitted from the third terminal T3 to the pulse generation circuit 74 through the reference layer 14, the non-magnetic layer 13, the recording layer 12, the channel layer 11, and the second terminal T2. A pulse height of the read-out pulse Pr2 is set to a magnitude depending on element resistance based on the magnetization state of the recording layer 12. The pulse generation circuit 74 determines the magnetization state of the recording layer 12 from the pulse height of the read-out pulse Pr2. When the magnetization state that is determined is the parallel state, that is, when reversal of the magnetization state from an initial state is detected, a writing current pulse Pw2 corresponding to a spike pulse to be transmitted to another neuron circuit is output (fired), and a reset current pulse Preset2 for resetting the magnetoresistance effect element 62 is output. Accordingly, in this example, the pulse generation circuit 74 is set also as an initialization circuit. However, in a case there the determined magnetization state is the anti-parallel state, the pulse generation circuit 74 does not perform any operation.

When outputting the reset current pulse Preset2, the switch S31 is turned off, the switch S32 is switched to the ground side, the switch S33 is switched to the switch S34 side, and the switch S34 is switched to an output side of the pulse generation circuit 74. According to this, the reset current pulse Preset2 from the pulse generation circuit 74 is input to the second terminal T2, and a current thereof flows through the channel layer 11 toward the first terminal T1. The reset current pulse Preset2 is set to flow a current sufficient for reversal of the magnetization of the recording layer 12. Accordingly, the magnetization state of the recording layer 12 is reversed from the parallel state to the anti-parallel state, and thus the magnetoresistance effect element 62 is initialized.

Priority is given to states of respective switches when outputting the reset current pulse Preset2. In addition, output of the read-out pulse Pr1 due to turning-on of the switch S3 is performed when the writing current pulse Pw1 is not input, for example, whenever the writing current pulse Pw1 is input.

In the third embodiment, the recording layer of the magnetoresistance effect element is changed from the anti-parallel state to the parallel state by the writing current pulse from the pre-neuron circuits, but the recording layer may be changed from the parallel state to the anti-parallel state by the writing current pulse from the pre-neuron circuits.

In the third embodiment, as in the second embodiment, the temperature of the recording layer is raised by the preceding writing current pulse to be energetically excited from the most stable state, and the magnetization state of the recording layer is changed by the subsequent writing current pulse. Even in this third embodiment, magnetization can be controlled with a plurality of writing current pulses by using an energetic excitation method other than the temperature rising. Specifically, design may be made so that when magnetization moves dynamically on the basis of a Landau-Lifshitz-Gilbert equation, the magnetization moves with a preliminary applied $n-1^{th}$ writing current pulse away from an equilibrium state, and the magnetization reversal is induced by an $n^{th}$ writing current pulse. In this case, as a pulse width of the writing current pulse, a range of 10 ps to 5 ns is preferable, and a typical frequency of the plurality of writing current pulses which are applied becomes approximately 500 MHz to 5 GHz. In this manner, with regard to the change of the magnetization state of the recording layer in this example, in broader meaning, the recording layer is energetically excited from the most stable state with the preceding $n-1^{th}$ writing current pulse, and the magnetization state of the recording layer is changed with the subsequent $n^{th}$ writing current pulse.

As described in the second embodiment and the third embodiment, the recording layer is set to any one magnetization state by flowing a current by a plurality of current pulses between the first terminal and the second terminal which are connected to the channel layer, and thus use as a synapse element in a neural network circuit, an element that performs integration in a neuron circuit, or the like is possible.

A neuron function called a so-called coincidence detector, which fires when signals input from a plurality of routes are input in close time and does not fire when the signals are input at distant time, can be realized by using the magnetoresistance effect element as in the third embodiment. That is, design can be made so that when writing current pulses with the same symbol are input from a plurality of routes to the same input terminal (any one of the first terminal and the second terminal) of the magnetoresistance effect element, in a case where an input interval (time difference) of the writing current pulses is equal to or shorter than predetermined time, magnetization of the recording layer is reversed, and in a case where the input interval exceeds the predetermined time, magnetization is not reversed.

The time difference between inputs of the plurality of writing current pulses for causing the magnetization reversal to occur is determined by a pulse width and a pulse height of the plurality of writing current pulses. This is similar to the third embodiment. According to an experiment performed by the present inventors by using two writing current pulses, they found that in a case where the pulse width is 25 ns, and the pulse height at the pulse width is smaller than a threshold for causing the magnetization reversal of the recording layer, the magnetization reversal is induced when an input time difference between the two writing current pulses is approximately 20 ns or less, and in a case where the pulse width is set to 175 ns, the magnetization reversal is induced when the time difference is approximately 150 ns or less. By using such properties, it is possible to realize a function as the coincidence detector, and thus it is possible to determine whether or not correlation of a plurality of input signal exists. This is one of important functions of the neural network.

Figure 25:
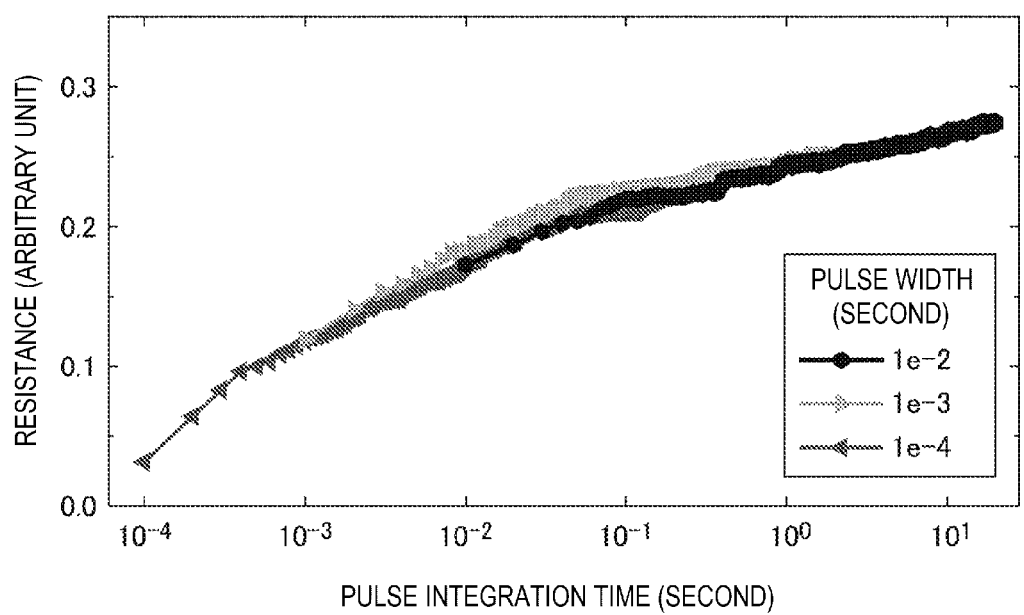
FIG. 25 is a graph showing a relationship between a pulse width integration time of the writing current pulse and resistance of the magnetoresistance effect element.

A graph in FIG. 25 shows results obtained by measuring resistance values of the magnetoresistance effect element for integration time of the pulse width of the writing current pulse that is input to, for example, the second terminal of the magnetoresistance effect element capable of storing multi-values with respect to several pulse widths. Here, a sufficient interval (millimeter second or longer) is provided between a plurality of writing current pulses which are input. From the measurement results, it can be understood that even when pulse widths of writing current pulses having the same pulse height are different from each other, when integration time of the pulse widths is the same in each case, the same resistance value can be set. That is, two or greater writing current pulses are input to any one or both the first terminal and the second terminal, and change into a magnetization state corresponding to the sum of the pulse widths of the two or greater writing current pulses can be made. In addition, a variation of a resistance value is influenced by the pulse height of the writing current pulse, and thus it can be understood that change into a magnetization state corresponding to the product sum of the pulse width and the pulse height of the two or greater writing current pulses can be made. By using the properties, in addition to the neural network circuit and the neuron circuit described above, it is possible to provide a circuit unit such as a counter and a circuit device which are used in Neumann architecture in the related art.

REFERENCE SIGNS LIST 10, 20, 30, 40, 41, 42, 53, 62 Magnetoresistance effect element
11 Channel layer
12 Recording layer
13 Non-magnetic layer
14 Reference layer
50 Neural network circuit
60 Neuron circuit
T1 First terminal
T2 Second terminal
T3 Third terminal

The invention claimed is:

1. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer, wherein
the plurality of pulses include a first current pulse and a second current pulse, wherein the first current pulse is input to the first terminal, and the second current pulse that causes a current to flow to the channel layer in a direction opposite to a direction in the first current pulse is input to the second terminal,
the recording layer is changed to a first magnetization state in which a magnetization direction is parallel to the magnetization direction of the reference layer, a second magnetization state in which the magnetization direction is anti-parallel to the magnetization direction of the reference layer, and at least one magnetization state between the first magnetization state and the second magnetization state, and the recording layer is energetically excited by a preceding current pulse of the first current pulse and the second current pulse which are input within predetermined time, and is changed to at least one magnetization state by the subsequent current pulse of the first current pulse and the second current pulse.

2. The magnetoresistance effect element according to claim 1,
wherein the channel layer is formed from an antiferromagnetic material.

3. The magnetoresistance effect element according to claim 1,
wherein a temperature of the recording layer is raised by the first current pulse or the second current pulse, and thus the recording layer is energetically excited.

4. The magnetoresistance effect element according to claim 3,
wherein the predetermined time is within a range of 10 ns to 10 μs.

5. The magnetoresistance effect element according to claim 1,
wherein a magnitude in change of the magnetization state of the recording layer is determined on the basis of an input time difference between the first current pulse and the second current pulse.

6. The magnetoresistance effect element according to claim 1,
wherein a pulse width of the first current pulse and the second current pulse is within a range of 10 ns to 10 μs.

7. The magnetoresistance effect element according to claim 1,
wherein in the first current pulse and the second current pulse, a ratio with respect to a pulse width of the predetermined time is within a range of 0.1 to 50.

8. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer, wherein
the plurality of pulses are two or greater of current pulses input to any one of the first terminal and the second terminal, and the magnetization state of the recording layer is changed by the two or greater current pulses input within predetermined time, and n pieces of (n is an integer of two or greater) of the current pulses depending on a pulse frequency are input to the recording layer, the recording layer is energetically excited to be equal to or greater than a threshold with which the magnetization state of the recording layer is changed by from first to $(n-1)^{th}$ current pulses, and the magnetization state is changed by the $n^{th}$ current pulse.

9. The magnetoresistance effect element according to claim 8,
wherein the recording layer is changed to any one of a first magnetization state in which a magnetization direction is parallel to the magnetization direction of the reference layer and a second magnetization state in which the magnetization direction is anti-parallel to the magnetization direction of the reference layer.

10. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer,
wherein the current pulse causes a current, which is smaller than a current that changes the magnetization state of the recording layer in a state of not being energetically excited by the current pulse, to flow to the channel layer.

11. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and a third terminal that is electrically connected to the reference layer, wherein the plurality of pulses are two or greater of current pulses input to any one or both of the first terminal and the second terminal, and the recording layer is changeable to any one among a first magnetization state in which a magnetization direction is parallel to the magnetization direction of the reference layer, a second magnetization state in which the magnetization direction is anti-parallel to the magnetization direction of the reference layer, and one or a plurality of magnetization states between the first magnetization state and the second magnetization state, and is changed to a magnetization state corresponding to the sum of products of a pulse width and a pulse height of the two or greater current pulses.

12. The magnetoresistance effect element according to claim 1, wherein either the first terminal or the second terminal, and the third terminal constitute an output terminal pair, a current or a voltage corresponding to the magnetization state of the recording layer is output, when a voltage or a current is applied between the output terminal pair.

13. A magnetoresistance effect element comprising:

a channel layer that is formed from a material that does not have net magnetization, and extends in a first direction;

a recording layer which includes a film formed from a ferromagnetic material, of which a magnetization state is changed to one of two or greater magnetization states, and which is formed on one surface of the channel layer;

a non-magnetic layer that is provided on a surface of the recording layer which is opposite to the channel layer;

a reference layer which is provided on a surface of the non-magnetic layer which is opposite to the recording layer, which includes a film formed from a ferromagnetic material, and of which a magnetization direction is fixed;

a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and a third terminal that is electrically connected to the reference layer, wherein the plurality of pulses include a first current pulse and a second current pulse, wherein the first current pulse is input to the first terminal, and the second current pulse that causes a current to flow to the channel layer in a direction opposite to a direction in the first current pulse is input to the second terminal, the recording layer is changed to a first magnetization state in which a magnetization direction is parallel to the magnetization direction of the reference layer, a second magnetization state in which the magnetization direction is anti-parallel to the magnetization direction of the reference layer, and at least one magnetization state between the first magnetization state and the second magnetization state, and the recording layer has a multi-domain structure, and the magnetization state of the recording layer is changed by change in a ratio between the first magnetization that is parallel to the magnetization direction of the reference layer and the second magnetization that is anti-parallel to the magnetization direction of the reference layer.

14. A magnetoresistance effect element comprising:

a channel layer that is formed from a material that does not have net magnetization, and extends in a first direction;

a recording layer which includes a film formed from a ferromagnetic material, of which a magnetization state is changed to one of two or greater magnetization states, and which is formed on one surface of the channel layer;

a non-magnetic layer that is provided on a surface of the recording layer which is opposite to the channel layer;

a reference layer which is provided on a surface of the non-magnetic layer which is opposite to the recording layer, which includes a film formed from a ferromagnetic material, and of which a magnetization direction is fixed;

a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and a third terminal that is electrically connected to the reference layer, wherein the channel layer is constituted by an antiferromagnetic material, and an exchange bias magnetic field operating between the channel layer and the recording layer is 50 mT or greater.

15. A magnetoresistance effect element comprising:

a channel layer that is formed from a material that does not have net magnetization, and extends in a first direction;

a recording layer which includes a film formed from a ferromagnetic material, of which a magnetization state is changed to one of two or greater magnetization states, and which is formed on one surface of the channel layer;

a non-magnetic layer that is provided on a surface of the recording layer which is opposite to the channel layer;

a reference layer which is provided on a surface of the non-magnetic layer which is opposite to the recording layer, which includes a film formed from a ferromagnetic material, and of which a magnetization direction is fixed;

a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and a third terminal that is electrically connected to the reference layer, wherein an exchange bias magnetic field operating between the channel layer and the recording layer is less than 50 mT.

16. The magnetoresistance effect element according to claim 1, wherein the recording layer has a structure in which Co and Ni are laminated.

17. The magnetoresistance effect element according to claim 1,
wherein the reference layer has a laminated ferri structure in which a non-magnetic coupling layer is interposed between two ferromagnetic layers.

18. The magnetoresistance effect element according to claim 1,
wherein the channel layer has a polycrystalline structure.

19. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer,
wherein resistivity of the channel layer is in a range of 10 to 1000 μΩ·cm.

20. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer,
wherein one to six layers of non-magnetic atomic layers are formed between the channel layer and the recording layer.

21. A magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer,
wherein a surface is covered with a material having thermal conductivity of 0.5 to 180 W/(m·K).

22. A circuit device comprising:
a magnetoresistance effect element comprising:
a channel layer that is formed from a material that does not have net magnetization, and extends in a first direction;
a recording layer which includes a film formed from a ferromagnetic material, of which a magnetization state is changed to one of two or greater magnetization states, and which is formed on one surface of the channel layer;
a non-magnetic layer that is provided on a surface of the recording layer which is opposite to the channel layer;
a reference layer which is provided on a surface of the non-magnetic layer which is opposite to the recording layer, which includes a film formed from a ferromagnetic material, and of which a magnetization direction is fixed;
a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
a third terminal that is electrically connected to the reference layer, wherein
the plurality of pulses include a first current pulse and a second current pulse, wherein the first current pulse is input to the first terminal, and the second current pulse that causes a current to flow to the channel layer in a direction opposite to a direction in the first current pulse is input to the second terminal,
the recording layer is changed to a first magnetization state in which a magnetization direction is parallel to the magnetization direction of the reference layer, a second magnetization state in which the magnetization direction is anti-parallel to the magnetization direction of the reference layer, and at least one magnetization state between the first magnetization state and the second magnetization state;

a pre-neuron circuit that is connected to the first terminal, and inputs the current pulse to the first terminal in synchronization with a firing timing; and a post-neuron circuit that is connected to the second terminal, and inputs the current pulse to the second terminal in synchronization with a firing timing.

23. The circuit device according to claim 22, wherein the pre-neuron circuit applies a voltage or a current to one output terminal of an output terminal pair including either the first terminal or the second terminal, and the third terminal at the firing timing, and when the voltage or the current is applied to the one output terminal, the current or the voltage from the one output terminal of the output terminal pair is input to the post-neuron circuit.

24. A circuit unit comprising:

a magnetoresistance effect element comprising:

- a channel layer that is formed from a material that does not have net magnetization, and extends in a first direction;
- a recording layer which includes a film formed from a ferromagnetic material, of which a magnetization state is changed to one of two or greater magnetization states, and which is formed on one surface of the channel layer;
- a non-magnetic layer that is provided on a surface of the recording layer which is opposite to the channel layer;
- a reference layer which is provided on a surface of the non-magnetic layer which is opposite to the recording layer, which includes a film formed from a ferromagnetic material, and of which a magnetization direction is fixed;
- a terminal pair that includes a first terminal and a second terminal which are electrically connected to the channel layer with an interval in the first direction, and to which a current pulse for bringing the recording layer to any one magnetization state with a plurality of pulses is input by flowing a current to the channel layer between the first terminal and the second terminal; and
- a third terminal that is electrically connected to the reference layer, wherein the plurality of pulses are two or greater of current pulses input to any one of the first terminal and the second terminal, and the magnetization state of the recording layer is changed by the two or greater current pulses input within predetermined time; and a pulse generation circuit that generates a pulse by detecting reversal of a magnetization direction of the magnetoresistance effect element from an initial state, wherein a neuron circuit is connected to any one input terminal between the first terminal and the second terminal of the magnetoresistance effect element, and the current pulse is input to the one input terminal in synchronization with firing timing of the neuron circuit.

25. The circuit unit according to claim 24, further comprising:

a read-out circuit that applies a voltage or a current to one output terminal of an output terminal pair including either the first terminal or the second terminal, and the third terminal, and outputs the current or the voltage from the other output terminal, wherein the pulse generation circuit detects the reversal of the magnetization direction of the magnetoresistance effect element from the initial state on the basis of a current or a voltage output from the other output terminal due to application of the voltage or the current.

26. The circuit unit according to claim 24, further comprising:

an initialization circuit that inputs the current pulse for reversing the recording layer to the initial state to the other input terminal between the first terminal and the second terminal after generation of the pulse by the pulse generation circuit.

* * * * *